(12) United States Patent
Lee et al.

(10) Patent No.: US 12,199,216 B2
(45) Date of Patent: Jan. 14, 2025

(54) DISPLAY DEVICE FEATURING SPACED APART INSULATING LAYER PATTERNS

(71) Applicant: Samsung Display Co., LTD., Yongin-si (KR)

(72) Inventors: Jong Won Lee, Hwaseong-si (KR); Hyun Min Cho, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 524 days.

(21) Appl. No.: 17/470,383

(22) Filed: Sep. 9, 2021

(65) Prior Publication Data
US 2022/0102585 A1 Mar. 31, 2022

(30) Foreign Application Priority Data
Sep. 29, 2020 (KR) .......................... 10-2020-0127049

(51) Int. Cl.
| | |
|---|---|
| *H01L 33/00* | (2010.01) |
| *H01L 25/075* | (2006.01) |
| *H01L 27/15* | (2006.01) |
| *H01L 33/38* | (2010.01) |
| *H01L 33/44* | (2010.01) |

(52) U.S. Cl.
CPC ........ *H01L 33/382* (2013.01); *H01L 25/0753* (2013.01); *H01L 27/156* (2013.01); *H01L 33/44* (2013.01)

(58) Field of Classification Search
CPC ..... H01L 25/0753; H01L 33/36; H01L 33/38; H01L 33/44; H10K 50/86; H10K 50/865; H10K 59/80; H10K 59/86
See application file for complete search history.

(56) References Cited

U.S. PATENT DOCUMENTS

2018/0175009 A1* 6/2018 Kim ........................ H01L 33/20
2022/0173274 A1    6/2022 Lee et al.

FOREIGN PATENT DOCUMENTS

KR    10-2018-0007025    1/2018
KR    10 2022 0077177    6/2022

OTHER PUBLICATIONS

"Exposed." Merriam-Webster.com. 2024. https://www.merriam-webster.com/dictionary/exposed (Apr. 18, 2024). (Year: 2024).*

* cited by examiner

*Primary Examiner* — Reema Patel
(74) *Attorney, Agent, or Firm* — KILE PARK REED & HOUTTEMAN PLLC

(57) ABSTRACT

A display device comprises a substrate, a first electrode on the substrate and extending in a first direction, a second electrode on the substrate and extending in the first direction, the second electrode being spaced apart from the first electrode in a second direction, a first insulating layer on the first electrode and the second electrode, light-emitting elements on the first insulating layer, the light-emitting elements being disposed on the first electrode and the second electrode, a second insulating layer disposed on the light-emitting elements, a first contact electrode disposed on the first electrode and electrically contacting the light-emitting elements, and a second contact electrode disposed on the second electrode and electrically contacting the light-emitting elements. The second insulating layer comprises patterns that cover at least part of the light-emitting elements and are spaced apart from one another in the first direction.

15 Claims, 21 Drawing Sheets

DISPLAY DEVICE FEATURING SPACED APART INSULATING LAYER PATTERNS

CROSS-REFERENCE TO RELATED APPLICATION(S)

This application claims priority to and benefits of Korean Patent Application No. 10-2020-0127049 under 35 U.S.C. § 119, filed on Sep. 29, 2020 in the Korean Intellectual Property Office, the entire contents of which are herein incorporated by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel and a liquid-crystal display panel for displaying images. Among them, a light-emitting display panel may include light-emitting elements. For example, light-emitting diodes (LEDs) may include an organic light-emitting diode using an organic material as a luminescent material, or an inorganic light-emitting diode using an inorganic material as a luminescent material.

SUMMARY

Aspects of the disclosure provide a display device that may include improved light emission efficiency of light-emitting elements.

It should be noted that aspects of the disclosure are not limited to the above; and other aspects of the disclosure will be apparent to those skilled in the art from the following descriptions.

According to an embodiment of the disclosure, an insulating layer that may fix the light-emitting elements in a display device may include a plurality of patterns. The patterns may be spaced apart from one another while fixing the light-emitting elements, so that light emission efficiency of light emitted from the light-emitting elements can be improved.

It should be noted that effects of the disclosure are not limited to those described above and other effects of the disclosure will be apparent to those skilled in the art from the following descriptions.

According to an embodiment of the disclosure, a display device may comprise a substrate, a first electrode on the substrate and extending in a first direction, a second electrode on the substrate and extending in the first direction, the second electrode being spaced apart from the first electrode in a second direction, a first insulating layer on the first electrode and the second electrode, light-emitting elements on the first insulating layer, the light-emitting elements being disposed on the first electrode and the second electrode, a second insulating layer disposed on the light-emitting elements, a first contact electrode disposed on the first electrode and electrically contacting the light-emitting elements, and a second contact electrode disposed on the second electrode and electrically contacting the light-emitting elements. The second insulating layer may comprise patterns that cover at least part of the light-emitting elements and may be spaced apart from one another in the first direction.

A length of each of the patterns measured in the second direction may be smaller than a length of the light-emitting elements. The first contact electrode may contact an end of each of the light-emitting elements, the second contact electrode may contact another end of each of the light-emitting elements, the end and the another end of each of the light-emitting elements may be exposed, and the patterns may not be disposed on the end and the another end of each of the light-emitting elements.

A length of each of the patterns measured in the first direction may be greater than a distance between the patterns spaced apart from one another in the first direction.

The display device may further comprise first banks disposed between the substrate and the first electrode and between the substrate and the second electrode. The patterns of the second insulating layer may be between the first banks.

A length of each of the patterns measured in the first direction may be greater than a distance between a center of the patterns and a center of the first banks.

The light-emitting elements may not be disposed between the patterns spaced apart in the first direction.

The first contact electrode and the second contact electrode may be disposed directly on the first insulating layer between the patterns spaced apart from one another in the first direction.

The second insulating layer may comprise an organic insulating material, and each of the patterns may have a flat upper surface.

The second insulating layer may comprise an organic insulating material, and each of the patterns may have a curved upper surface.

Each of the first contact electrode and the second contact electrode may comprise first electrode portions partially disposed over the patterns, and second electrode portions disposed between the first electrode portions and located between the patterns spaced apart from one another. A width of the first electrode portions may be greater than a width of the second electrode portions.

A length of the first electrode portions measured in the first direction may be equal to a length of the pattern parts, and a distance between the first electrode portions in the first direction may be equal to a distance between the patterns in the first direction.

The display device may further comprise structures between the patterns which may be spaced apart from one another in the first direction. The light-emitting elements may be disposed between the structures which may be spaced apart from one another in the first direction.

A width of the structures measured in the second direction may be smaller than a distance between the first electrode and the second electrode.

Each of the structures may comprise a bottom layer, and an upper layer disposed to cover the bottom layer. The upper layer and the first electrode or the upper layer and the first contact electrode may comprise a same material.

The second insulating layer may comprise a base that overlaps the first electrode and the second electrode, and the base may be spaced apart from the light-emitting elements in the second direction.

The display device may further comprise a third insulating layer disposed on the second insulating layer. The first contact electrode may be disposed on the third insulating layer, and the second contact electrode may be disposed between the second insulating layer and the third insulating layer.

According to an embodiment of the disclosure, a display device may comprise a first electrode extending in a first direction, a second electrode extending in the first direction and spaced apart from the first electrode in a second direction, a first insulating layer on the first electrode and the second electrode, light-emitting elements on the first insulating layer, the light-emitting elements being disposed on the first electrode and the second electrode, a second insulating layer on the light-emitting elements, a first contact electrode on the first electrode and electrically contacting the light-emitting elements, and a second contact electrode on the second electrode and electrically contacting the light-emitting elements. The second insulating layer may comprise a pattern that covers the light-emitting elements and may be extended in the first direction. The pattern may comprise first portions having a first thickness, and a second portion disposed between the first portions and having a second thickness smaller than the first thickness.

The light-emitting elements may comprise first light-emitting elements disposed under the first portions of the pattern, and a second light-emitting element disposed under the second portion of the pattern.

The second insulating layer may comprise an organic insulating material, and each of the first and second portions of the pattern may include a flat upper surface.

The second insulating layer may comprise an organic insulating material. Each of the first portions may have a curved upper surface and the second portion may have a flat upper surface.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
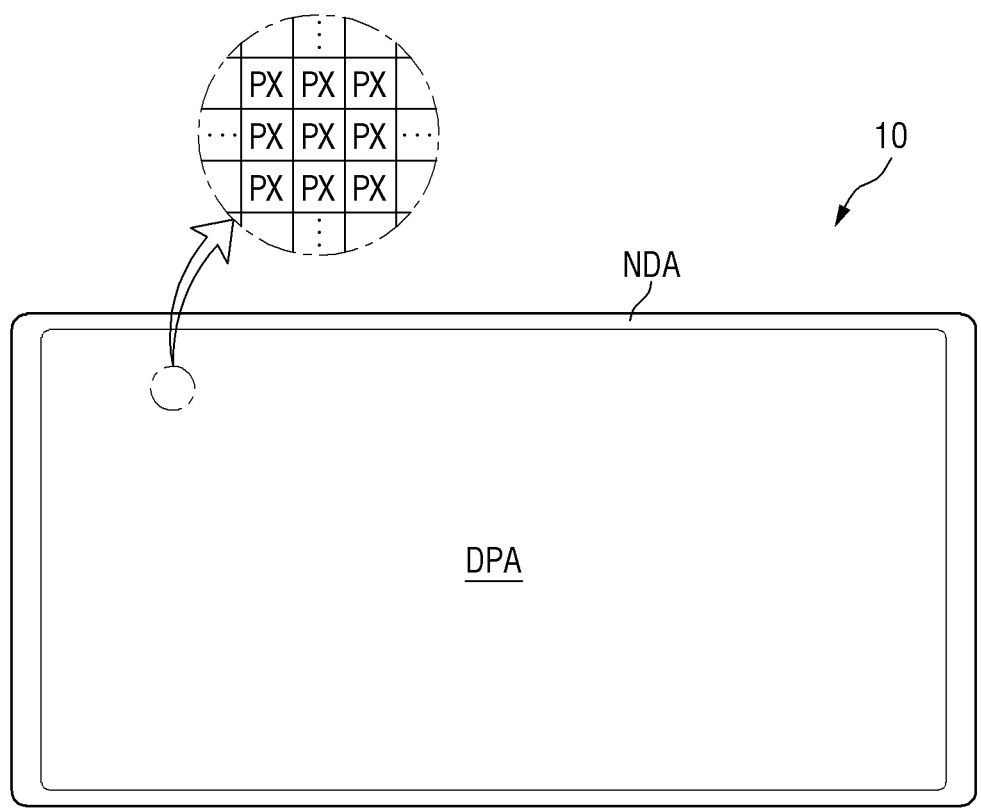
FIG. 1 is a schematic plan view of a display device according to an embodiment of the disclosure.
Figure 1:
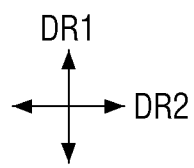

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise. The terms "comprises," "comprising," "includes," and/or "including,", "has," "have," and/or "having," and variations thereof when used herein, specify the presence of stated features, integers, steps, operations, elements, components, and/or groups thereof, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one" of is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

When an element is referred to as being "in contact" or "contacted" or the like to another element, the element may be in "electrical contact" or in "physical contact" with another element; or in "indirect contact" or in "direct contact" with another element.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, the display device 10 may display a moving image or a still image. The display device 10 may refer to any electronic device that provides a display screen. For example, the display device 10 may include a television set, a laptop computer, a monitor, an electronic billboard, an Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, or the like.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, or the like. In the following description, an inorganic light-emitting diode display panel is employed as an example of the display panel 10, but the disclosure is not limited thereto. Any other display panel may be employed as long as the technical idea of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, or the like. The shape of a display area DPA of the display device 10 may also be similar to the overall shape of the display device 10. In the example shown in FIG. 1, the display device 10 has a rectangular shape with longer sides in a second direction DR2.

The display device 10 may include the display area DPA and a non-display area NDA. In the display area DPA, images can be displayed. In the non-display area NDA, images may not be displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes or a PENTILE™ pattern alternately. Each of the pixels PX may include at least one light-emitting element that emits light of a particular wavelength band to represent a color.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
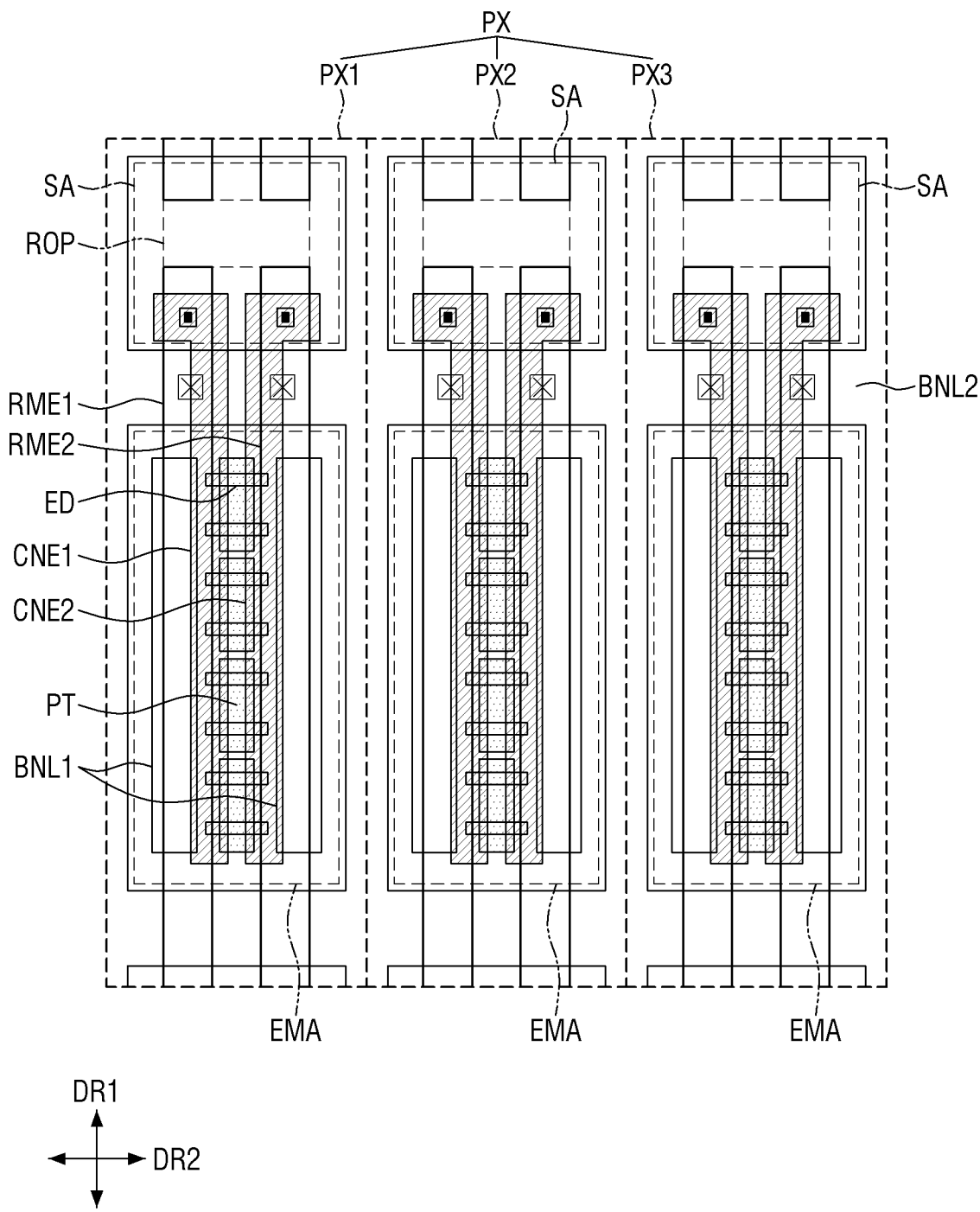
FIG. 2 is a schematic plan view showing a pixel of a display device according to an embodiment of the disclosure.

FIG. 2 is a schematic plan view showing a pixel of a display device according to an embodiment of the disclosure.

Referring to FIG. 2, each of the pixels PX of the display device 10 may include sub-pixels PXn, where n may be an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of the same color. Although the single pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area EMA and a non-emission area. In the emission area EMA, light-emitting elements (e.g., light-emitting diodes ED) may be disposed to emit light of a particular wavelength. In the non-emission area, no light-emitting diodes ED may be disposed and light emitted from the light-emitting diodes ED may not reach and thus no light may exit therefrom. The emission area may include an area in which the light-emitting diodes ED may be disposed, and may include an area adjacent to the light-emitting diodes ED where lights emitted from the light-emitting diode ED exit.

It is, however, to be understood that the disclosure is not limited thereto. The emission area may also include an area in which light emitted from the light-emitting diode ED may be reflected or refracted by other elements to exit. The light-emitting diodes ED may be disposed in each of the sub-pixels PXn, and the emission area may include the area where the light-emitting diodes ED may be disposed and the adjacent area.

Although the emission areas EMA of the sub-pixels PXn have a substantially uniform area in the example shown in the drawings, the disclosure is not limited thereto. In some embodiments, the emission areas EMA of the sub-pixels PXn may have different areas depending on a color or wavelength band of light emitted from the light-emitting diodes ED disposed in the respective sub-pixels.

Each of the sub-pixels PXn may further include a subsidiary area SA disposed in the non-emission area. The subsidiary area SA may be disposed on a side of the emission area EMA in the first direction DR1, and may be disposed between the emission areas EMA of the sub-pixels PXn adjacent to each other in the first direction DR1. For example, the emission areas EMA and the subsidiary areas SA may be arranged repeatedly in the second direction DR2, and may be arranged alternately in the first direction DR1. A second bank BNL2 may be disposed between the subsidiary areas SA and the emission areas EMA, and the distance between them may vary depending on the width of the second bank BNL2. No light-emitting diode ED may be disposed in the subsidiary areas SA and thus no light may exit therefrom. The electrodes RME1 and RME2 disposed in each of the sub-pixels PXn may be partially disposed in the subsidiary areas SA. The electrodes RME1 and RME2 disposed in some of the sub-pixels PXn may be disposed separately from one another in the subsidiary areas SA.

The second bank BNL2 may be disposed in a lattice pattern on the entire surface of the display area DPA including portions extended in the first direction DR1 and the second direction DR2 when viewed from the top. The second bank BNL2 may be disposed along the border of each of the sub-pixels PXn to distinguish adjacent sub-pixels PXn from one another. The second bank BNL2 may be disposed to surround the emission area EMA and the subsidiary area SA disposed in each of the sub-pixels PXn to distinguish the emission area EMA and the subsidiary area SA.

Figure 3:
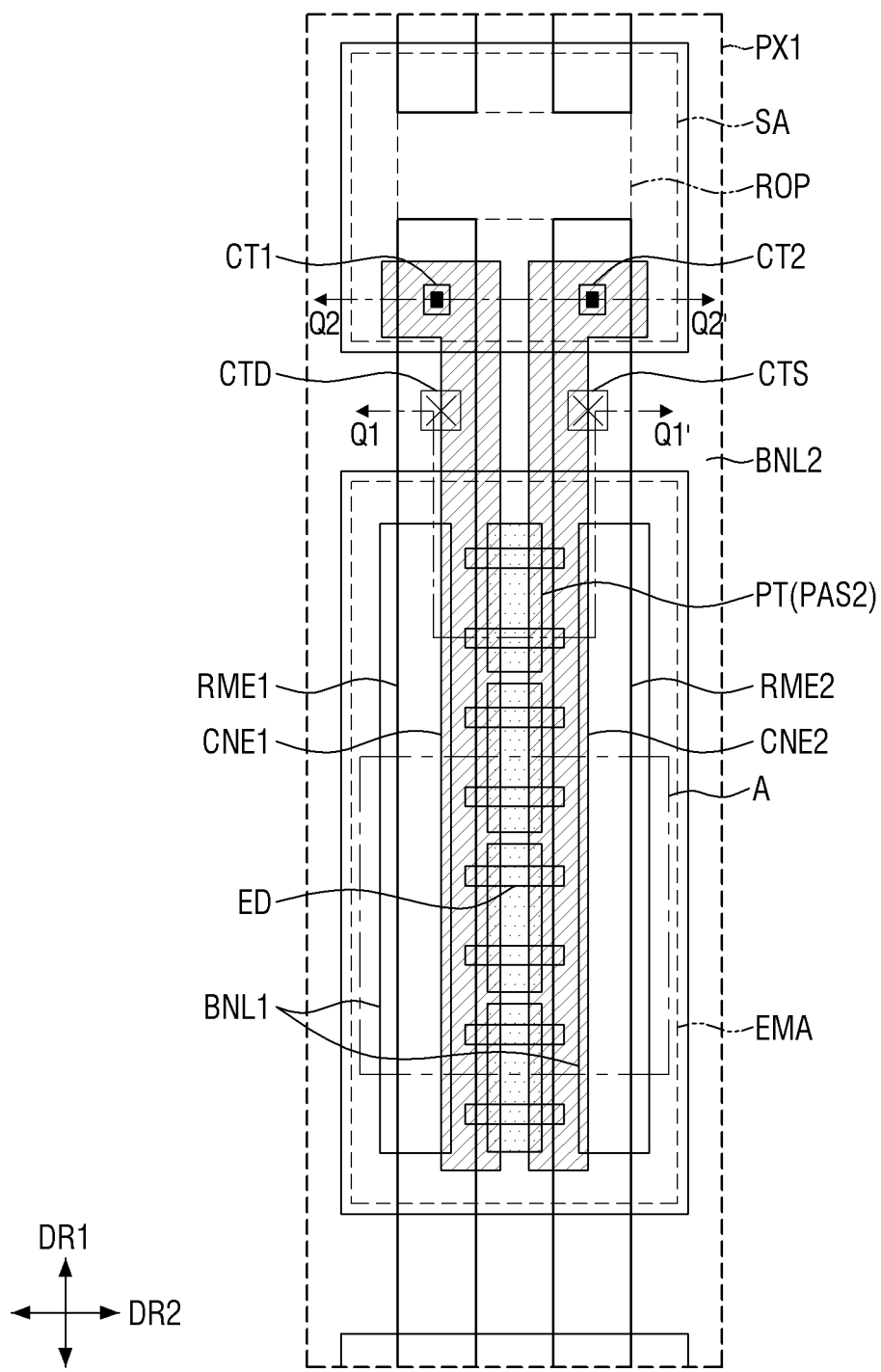
FIG. 3 is a schematic plan view showing a first sub-pixel of FIG. 2.
Figure 4:
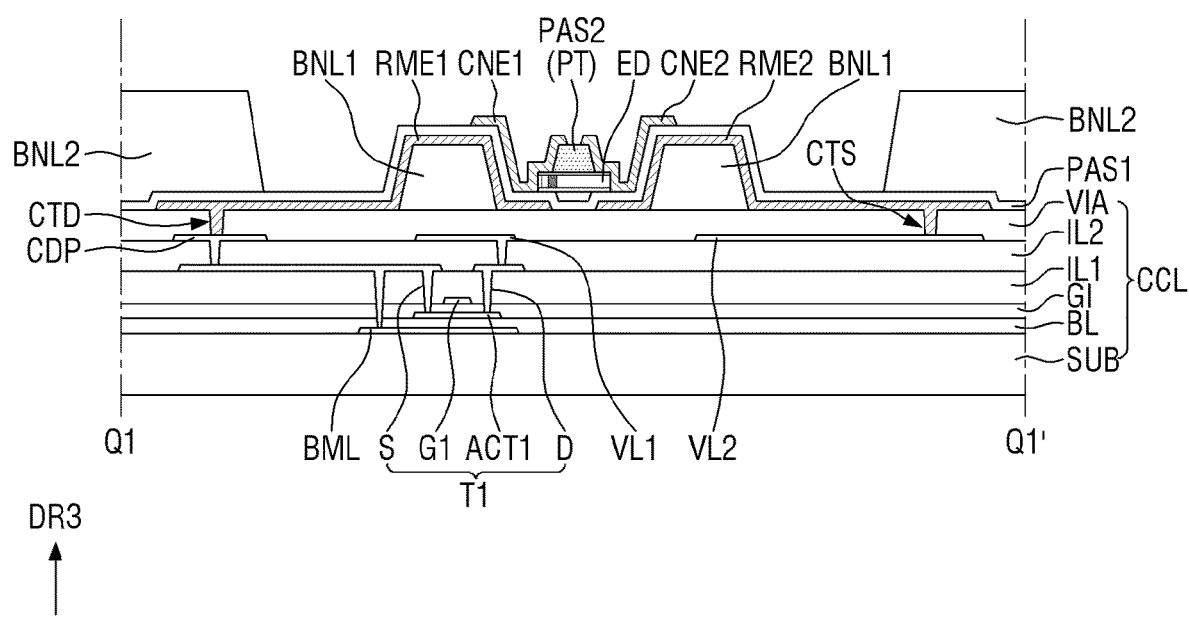
FIG. 4 is a schematic cross-sectional view taken along line Q1-Q1' of FIG. 3.
Figure 5:
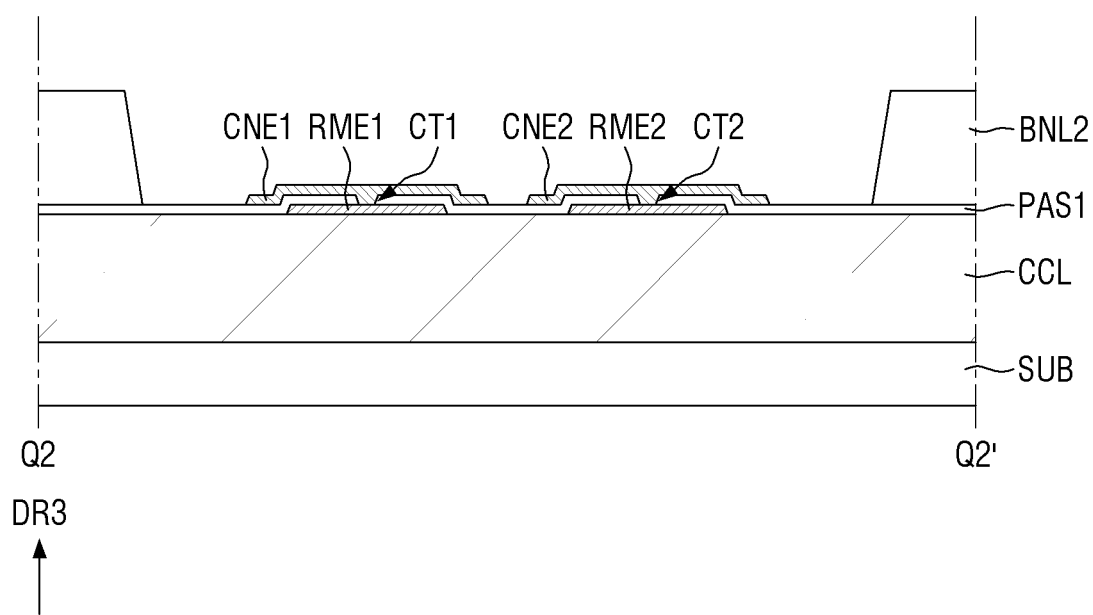
FIG. 5 is a schematic cross-sectional view taken along line Q2-Q2' of FIG. 3.

FIG. 3 is a schematic plan view showing a first sub-pixel of FIG. 2. FIG. 4 is a schematic cross-sectional view taken along line Q1-Q1' of FIG. 3. FIG. 5 is a schematic cross-sectional view taken along line Q2-Q2' of FIG. 3. FIG. 3 shows the first sub-pixel PX1 included in the pixel PX. FIG. 4 shows a cross section from an end to another end of the light-emitting diode ED disposed in the first sub-pixel PX1. FIG. 5 shows a cross-section of contact portions CT1 and CT2 where electrodes RME1 and RME2 may be connected with contact electrodes CNE1 and CNE2, respectively.

Referring to FIGS. 3 to 5 in conjunction with FIG. 2, the display device 10 may include a first substrate SUB, a semiconductor layer disposed on the first substrate SUB, conductive layers, and insulating layers. The semiconductor layer, the conductive layers and the insulating layers may form a circuit layer CCL and a display element layer of the display device 10.

The first substrate SUB may be an insulating substrate. The first substrate SUB may be made of an insulating material such as glass, quartz, a polymer resin, or a combination thereof. The first substrate SUB may be either a rigid substrate or a flexible substrate that can be bent, folded, or rolled.

A first conductive layer may be disposed on the first substrate SUB. The first conductive layer may include a bottom metal layer BML. The bottom metal layer BML may be disposed to overlap an active layer ACT1 of a first transistor T1. The bottom metal layer BML may include a material that blocks light, and thus can prevent light from entering the active layer ACT1 of the first transistor T1. It is, however, to be noted that the bottom metal layer BML may be eliminated.

A buffer layer BL may be disposed entirely on the bottom metal layer BML and the first substrate SUB. The buffer layer BL may be formed on the first substrate SUB to protect the transistors of the pixel PX from moisture permeating through the first substrate SUB that may be susceptible to moisture permeation, and may also provide a flat surface.

The semiconductor layer may be disposed on the buffer layer BL. The semiconductor layer may include the active layer ACT1 of the first transistor T1. The active layer ACT1 may be disposed to partially overlap with a gate electrode G1 of a second conductive layer, etc., which will be described later.

The semiconductor layer may include at least one of polycrystalline silicon, monocrystalline silicon, an oxide semiconductor, or the like. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), or the like.

Although only the first transistor T1 among the transistors included in the sub-pixel PXn of the display device 10 is depicted in the drawing, the disclosure is not limited thereto. A larger number of transistors may be included in the display device 10.

A first gate insulating layer GI may be disposed on the semiconductor layer and the buffer layer BL. The first gate insulating layer GI may work as a gate insulator of each of the transistors.

The second conductive layer may be disposed on the first gate insulating layer GI. The second conductive layer may include a gate electrode G1 of the first transistor T1. The gate electrode G1 may be disposed so that it overlaps a channel region of the active layer ACT1 in the thickness direction, i.e., a third direction DR3. Although not shown in the drawings, the second conductive layer may further include a capacitor electrode of a storage capacitor.

A first interlayer dielectric layer IL1 may be disposed on the second conductive layer. The first interlayer dielectric layer IL1 may serve as an insulating layer between the second conductive layer and other layers disposed thereon and can protect the second conductive layer.

The third conductive layer may be disposed on the first interlayer dielectric layer IL1. The third conductive layer may include a first source electrode S and a first drain electrode D of the first transistor T1.

The first source electrode S and the first drain electrode D of the first transistor T1 may be in contact with the active layer ACT1 through contact holes penetrating through the first interlayer dielectric layer IL1 and the first gate insulating layer GI. The first source electrode S may be in contact with the bottom metal layer BML through another contact hole. Although not shown in the drawings, the third conductive layer may further include data lines or the capacitance electrode of the storage capacitor.

A second interlayer dielectric layer IL2 may be disposed on the third conductive layer. The second interlayer dielectric layer IL2 may serve as an insulating layer between the third conductive layer and other layers disposed thereon and can protect the third conductive layer.

The fourth conductive layer may be disposed on the second interlayer dielectric layer IL2. The fourth conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode RME2.

The first electrode pattern CDP may be electrically connected to the first transistor T1. The first conductive pattern CDP may also be connected to the first electrode RME1 to be described later. The first transistor T1 may transfer the first supply voltage (VDD) applied from the first voltage line VL1 to the first electrode RME1.

The buffer layer BL, the first gate insulating layer GI, the first interlayer dielectric layer IL1 and the second interlayer dielectric layer IL2 may be made up of multiple inorganic layers stacked on one another alternately. For example, the buffer layer BL, the first gate insulating layer GI, the first interlayer dielectric layer IL1 and the second interlayer dielectric layer IL2 may be made up of a double layer in which inorganic layers including at least one of silicon oxide (SiOx), silicon nitride (SiNx) and silicon oxynitride (SiON) may be stacked on one another or multiple layers in which they may be alternately stacked on one another. It is, however, to be understood that the disclosure is not limited thereto. The buffer layer BL, the first gate insulating layer GI, the first interlayer dielectric layer IL1 and the second interlayer dielectric layer IL2 may be made up of a single inorganic layer including the above-described insulating material.

The second conductive layer, the third conductive layer and the fourth conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) and an alloy thereof. It is, however, to be understood that the disclosure is not limited thereto.

A via layer VIA may be disposed on the fourth conductive layer. The via layer VIA may include an organic insulating material, e.g., an organic material such as polyimide (PI), to provide a flat surface.

Banks BNL1 and BNL2, electrodes RME1 and RME2, light-emitting diodes ED, and contact electrodes CNE1 and CNE2 may be disposed on the via layer VIA as the display elements layer. Passivation layers PAS1 and PAS2 may be disposed on the via layer VIA.

The first banks BNL1 may be disposed on (e.g., directly on) the via layer VIA. The first banks BNL1 may be extended in the first direction DR1 in the emission area EMA and may be spaced apart from each other in the second direction DR2. For example, the first banks BNL1 may be disposed on a side and an opposite side of each emission area EMA in the second direction DR2, respectively. The first banks BNL1 may have a shape extended in the first direction DR1 and may have a length smaller than the length of the area surrounded by the second bank BNL2 in the first direction DR1. That is to say, the first banks BNL1 may be disposed in the emission area EMA of the sub-pixel PXn to form an island-like pattern that has a relatively narrow width and may be extended in a direction on the front surface of the display area DPA.

The first banks BNL1 may have a structure that at least partly protrudes from the upper surface of the via layer VIA. The protrusions of the first banks BNL1 may have inclined side surfaces. The light emitted from the light-emitting diodes ED may be reflected by the electrodes RME1 and RME2 disposed on the first banks BNL1 so that the light may exit toward the upper side of the via layer VIA. It is, however, to be understood that the disclosure is not limited thereto. The first banks BNL1 may have a shape of a semi-circle or semi-ellipse having a curved outer surface. The first bank BNL1 may include, but is not limited to, an organic insulating material such as polyimide (PI).

The electrodes RME1 and RME2 may have a shape extended in a direction and may be disposed in each of the sub-pixels PXn. For example, the electrodes RME1 and RME2 may have a shape extended in the first direction DR1 and may be spaced apart from each other in the second direction DR2 in each of the sub-pixels PXn. The electrodes RME1 and RME2 of the display device 10 may include electrodes connected to (e.g., directly connected to) the fourth conductive layer thereunder through electrode contact holes CTD and CTS penetrating the via layer VIA. In some embodiments, the display device 10 may further include electrodes that may not be directly connected to the fourth conductive layer.

The electrodes RME1 and RME2 may be extended in the first direction DR1 and may be disposed across the emission area EMA and the sub area SA in each of the sub-pixels PXn. The electrodes RME1 and RME2 of the sub-pixels PXn may be separated from those of an adjacent sub-pixel PXn in the first direction DR1 at a separation region ROP of the subsidiary area SA. The electrodes RME1 and RME2 may be formed as electrode lines extended in the first direction DR1 during the process of fabricating the display device 10 and may be utilized to generate an electric field in the sub-pixel PXn to align the light-emitting diodes ED. The light-emitting diodes ED may be aligned by receiving a dielectrophoretic force generated by the electric field generated over the electrode lines. The electrode lines may be separated at the separation region ROP to form the electrodes RME1 and RME2.

The electrodes RME1 and RME2 will be described in detail. The first electrode RME1 and the second electrode RME2 may be disposed in a single sub-pixel PXn. The first electrode RME1 may be disposed on the first bank BNL1 on the left side of the emission area EMA, and the second electrode RME2 may be disposed on the first bank BNL1 on the right side of the emission area EMA. The first electrode RME1 and the second electrode RME2 may be spaced apart from each other and may face each other in the second direction DR2.

Each of the first electrode RME1 and the second electrode RME2 may be connected to the fourth conductive layer thereunder. The first electrode RME1 may be connected to (e.g., directly to) the fourth conductive layer through the first electrode contact hole CTD formed under the second bank BNL2, and the second electrode RME2 may be connected to (e.g., directly to) the fourth conductive layer through the second electrode contact hole CTS formed in the subsidiary area SA. For example, the first electrode RME1 may be in contact with the first conductive pattern CDP through the first contact hole CTD penetrating the via layer VIA thereunder. The second electrode RME2 may be in contact with the second voltage line VL2 through the second contact hole CTS penetrating through the via layer VIA thereunder. The first electrode RME1 may be electrically connected to the first transistor T1 through the first conductive pattern CDP to receive the first supply voltage. The second electrode RME2 may be electrically connected to the second voltage line VL2 to receive the second supply voltage. Since the first electrode RME1 and the second electrode RME2 may be disposed separately in each of the sub-pixels PXn, the light-emitting diodes ED of different sub-pixels PXn may emit light individually.

According to an embodiment of the disclosure, the width of the electrodes RME1 and RME2 measured in the second direction DR2 may be smaller than that of the first banks BNL1. The electrodes RME1 and RME2 may cover only the sides of the first banks BNL1 facing each other, respectively. It is, however, to be understood that the disclosure is not limited thereto. The width of the electrodes RME1 and RME2 in the second direction DR2 may be larger than that of the first banks BNL1, so that the electrodes RME1 and RME2 may cover both sides of the first banks BNL1, respectively. The electrodes RME1 and RME2 may be disposed to cover at least a side of the first banks BNL1, respectively, to reflect light emitted from the light-emitting diodes ED. The distance between the electrodes RME1 and RME2 spaced apart in the second direction DR2 may be smaller than the distance between the first banks BNL1. At least a part of each of the electrodes RME1 and RME2 may be disposed on (e.g., directly on) the via layer VIA so that they may be disposed on a same plane.

The electrodes RME1 and RME2 may be electrically connected to the light-emitting diodes ED. The electrodes RME1 and RME2 may be connected to both ends of the light-emitting diodes ED through the contact electrodes CNE1 and CNE2, and may transmit an electric signal applied from the fourth conductive layer to the light-emitting diodes ED. Electrical signals for allowing light-emitting diodes ED to emit light may be applied (e.g., directly applied) to the first electrode RME1 and the second electrode RME2, and the electric signals may be transmitted to other electrodes through the contact electrodes CNE1 and CNE2 and light-emitting diodes ED, which will be described later.

Each of the electrodes RME1 and RME2 may include a conductive material having a high reflectance. For example, each of the electrodes RME1 and RME2 may include a metal such as silver (Ag), copper (Cu) and aluminum (Al) as the material having a high reflectance, and may be an alloy including aluminum (Al), nickel (Ni), lanthanum (La), and the like. Each of the electrodes RME1 and RME2 may reflect light that may be emitted from the light-emitting diode ED and travels toward the side surfaces of the first banks BNL1 toward the upper side of each of the sub-pixels PXn.

It is, however, to be understood that the disclosure is not limited thereto. Each of the electrodes RME1 and RME2 may further include a transparent conductive material. For example, each of the electrodes RME1 and RME2 may include a material such as ITO, IZO, ITZO, or a combination thereof. In some embodiments, each of the electrodes RME1 and RME2 may have a structure in which one or more layers of a transparent conductive material and one or more metal layers having high reflectivity may be stacked on one another, or may be made up of a single layer including the materials. For example, each of the electrodes RME1 and RME2 may have a stack structure such as ITO/Ag/ITO/, ITO/Ag/IZO, or ITO/Ag/ITZO/IZO.

The first passivation layer PAS1 may be disposed on the electrodes RME1 and RME2 and the first banks BNL1. The first passivation layer PAS1 may be disposed to cover the electrodes RME1 and RME2 entirely, and can protect the electrodes RME1 and RME2 and insulate them from one another. The first passivation layer PAS1 can also prevent that the light-emitting diodes ED disposed thereon may be brought into contact with other elements and damaged.

In an embodiment, the first passivation layer PAS1 may have steps so that a part of the upper surface may be recessed between the electrodes RME1 and RME2 spaced apart from each other in the second direction DR2. The light-emitting diodes ED may be disposed in the steps of the upper surface of the first passivation layer PAS1, and a space may be formed between the light-emitting diodes ED and the first passivation layer PAS1. It is, however, to be understood that the disclosure is not limited thereto.

The first passivation layer PAS1 may include contact portions CT1 and CT2 exposing a part of the upper surface of each of the electrodes RME1 and RME2. The contact portions CT1 and CT2 may penetrate through the first passivation layer PAS1, and the contact electrodes CNE1 and CNE2 described later may be in contact with the electrodes RME1 and RME2 exposed via the contact portions CT1 and CT2.

The second bank BNL2 may be disposed on the first passivation layer PAS1. The second bank BNL2 may be disposed in a lattice pattern including parts extended in the first direction DR1 and the second direction DR2 when viewed from the top, and may be disposed at the boundaries of the sub-pixels PXn to distinguish the adjacent sub-pixels PXn from each other. The second bank BNL2 may be disposed to surround the emission area EMA and the subsidiary area SA disposed in each of the sub-pixels PXn to distinguish the emission area EMA and the subsidiary area SA.

According to an embodiment of the disclosure, the part of the second bank BNL2 that may be extended in the first direction DR1 and disposed between the emission areas EMA may have a larger width than the part disposed between the subsidiary areas SA. The distance between the subsidiary areas SA may be smaller than the distance between the emission areas EMA. It is, however, to be understood that the disclosure is not limited thereto. On the contrary, the width of the second bank BNL2 may vary so that the distance between the subsidiary areas SA may be larger than the distance between the emission areas EMA.

The second bank BNL2 may have a height greater than a height of the first banks BNL1. The second bank BNL2 can prevent an ink from overflowing into adjacent sub-pixels PXn during an inkjet printing process of the process of fabricating the display device 10. The second bank BNL2 can separate the different sub-pixels PXn from one another so that the ink in which different light-emitting diodes ED may be dispersed may not be mixed. It is, however, to be understood that the disclosure is not limited thereto. The second bank BNL2 may include the same material as the first banks BNL1 and may have a height similar to the height of the first banks BNL1.

The light-emitting diodes ED may be disposed on the first passivation layer PAS1. The light-emitting diodes ED may be spaced apart from one another in the first direction DR1 in which the electrodes RME1 and RME2 may be extended, and may be aligned substantially parallel to one another. The light-emitting diodes ED may have a shape extended in a direction. The direction in which the electrodes RME1 and RME2 may be extended may be substantially perpendicular to the direction in which the light-emitting diodes ED may be extended. It is, however, to be understood that the disclosure is not limited thereto. The light-emitting diodes ED may be oriented obliquely to the direction in which the electrodes RME1 and RME2 may be extended.

The light-emitting diodes ED may include semiconductor layers doped to have different conductivity types. The light-emitting diodes ED may include multiple semiconductor layers and may be aligned so that their ends may be directed in a particular orientation depending on the direction of the electric field generated over the electrodes RME1 and RME2. Each of the light-emitting diodes ED may include an emissive layer 36 (see FIG. 8) to emit light of a particular wavelength band. The light-emitting diodes ED disposed in each of the sub-pixels PXn may emit light of different wavelength bands depending on the material of the emissive layer 36. It is, however, to be understood that the disclosure is not limited thereto. The light-emitting diodes ED disposed in the sub-pixels PXn may emit light of the same color.

The light-emitting diodes ED may include multiple layers disposed on the upper surface of the first substrate SUB in the direction parallel to the first substrate SUB. The light-emitting elements diodes ED of the display device 10 may be arranged such that they may be extended in parallel to the first substrate SUB. The multiple semiconductor layers included in the light-emitting diodes ED may be disposed sequentially in the direction parallel to the upper surface of the first substrate SUB. It is, however, to be understood that the disclosure is not limited thereto. In some implementations, when the light-emitting diodes ED have a different structure, multiple layers may be disposed in a direction perpendicular to the first substrate SUB.

The light-emitting diodes ED may be disposed on the electrodes RME1 and RME2 spaced apart from each other in the second direction DR2 between the first banks BNL1. The length of the light-emitting diodes ED may be larger than the distance between the electrodes RME1 and RME2 spaced apart from one another in the second direction DR2, and the ends of the light-emitting diodes ED may be disposed on the electrodes.

Each of the light-emitting diodes ED may include semiconductor layers, and a first end and a second end opposite to the first end may be defined based on one of the semiconductor layers. Each of the light-emitting diodes ED may be disposed such that the first end and the second end may be placed on the respective electrodes RME1 and RME2. It is, however, to be understood that the disclosure is not limited thereto. The light-emitting diodes ED may be disposed such that only one end thereof may be placed on the electrodes RME1 and RME2 depending on the orientations between the electrodes RME1 and RME2.

The ends of each of the light-emitting diodes ED may be in contact with the contact electrodes CNE1 and CNE2, respectively. As a part of the semiconductor layer of the light-emitting diode ED may be exposed because the insulating film 38 (see FIG. 8) may not be formed at the end surface on the side of the extending direction, the exposed part of the semiconductor layer may be in contact with the contact electrode CNE1 and CNE2. It is, however, to be understood that the disclosure is not limited thereto. In some implementations, at least a part of the insulating film 38 may be removed, so that the end surfaces of the semiconductor layers of the light-emitting diodes ED may be partially exposed. The exposed side surfaces of the semiconductor layer may be in contact with the contact electrodes CNE1 and CNE2. Each of the light-emitting diodes ED may be electrically connected to the electrodes RME1 and RME2 or other light-emitting diodes ED through the contact electrodes CNE1 and CNE2.

The second passivation layer PAS2 may be disposed on the first passivation PAS1 and the light-emitting diodes ED. For example, the second passivation layer PAS2 may cover some of the light-emitting diodes ED arranged in the first direction DR1 between the electrodes RME1 and RME2, and may partially cover the outer surfaces of the light-emitting diodes ED. A part of the second passivation layer PAS2 may be disposed between the electrodes RME1 and RME2 or on (e.g., directly on) the first passivation layer PAS1 covering the sides where they face each other. The second passivation layer PAS2 can protect the light-emitting diodes ED and fix the light-emitting diodes ED during the process of fabricating the display device 10. The second passivation layer PAS2 may be disposed to fill the space between light-emitting diodes ED and the first passivation layer PAS1 thereunder.

According to an embodiment of the disclosure, the second passivation layer PAS2 may include multiple patterns PT covering at least one light-emitting diode ED. The patterns PT may be spaced apart from one another in the first direction DR1 between the first banks BNL1 or between the first electrode RME1 and the second electrode RME2 where the light-emitting diodes ED may be disposed. A pattern PT may have a constant width in the second direction DR2 and a shape extended in the first direction DR1, and may be disposed to cover one or more light-emitting diodes ED. Similar to the light-emitting diodes ED, the patterns PT may be arranged and spaced apart from one another in the first direction DR1.

The light generated in the emissive layer 36 may exit through the first end and the second end of each of the light-emitting diodes ED in the extending direction. Some of the lights may exit through the side surface of the emissive layer 36 or the side surfaces of the light-emitting diodes ED. The lights exiting through the side surfaces may be incident on the second passivation layer PAS2 and then may exit through the upper surface of the second passivation layer PAS2. According to an embodiment of the disclosure, the second passivation layer PAS2 includes the patterns PT to cover the light-emitting diodes ED, allowing the light emitted through the side surfaces of the light-emitting diodes ED to exit between the patterns PT spaced apart from one another. The display device 10 can have a structure in which the second passivation layer PAS2 fixes the light-emitting diodes ED and improves light emission efficiency. More detailed description thereon will be made below with reference to the other drawings.

Although not shown in the drawings, a part of the second passivation layer PAS2 may be disposed in the subsidiary area SA. The electrodes RME1 and RME2 may be formed by separating the electrode lines at the separation region ROP of the subsidiary area SA after aligning the light-emitting diodes ED and forming the second passivation layer PAS2. During the process of separating the electrode lines, the first passivation layer PAS1 and the second passivation layer PAS2 may be partially removed, in addition to the electrodes RME1 and RME2. A part of the via layer VIA may be exposed at the separation region ROP.

Each of the first passivation layer PAS1 and the second passivation layer PAS2 may include an inorganic insulating material or an organic insulating material. It is, however, to be understood that the disclosure is not limited thereto.

The contact electrodes CNE1 and CNE2 may be disposed on the second passivation layer PAS2. The contact electrodes CNE1 and CNE2 may be in contact with an end of each of the light-emitting diodes ED and at least one of the electrodes RME1 and RME2. The contact electrodes CNE1 and CNE2 may be in contact with the first end of each of the light-emitting diodes ED exposed where the second passivation layer PAS2 may not be disposed, and at least one of the electrodes RME1 and RME2 through the contact portions CT1 and CT2 that may be formed in the first passivation layer PAS1 and expose parts of the electrodes RME1 and RME2. For example, the contact electrodes CNE1 and CNE2 may include parts extended in the first direction DR1 and may be disposed across the emission area EMA and the subsidiary area SA. The parts of the contact electrodes CNE1 and CNE2 disposed in the emission area EMA may be in contact with the light-emitting diodes ED. The parts of the contact electrodes CNE1 and CNE2 disposed in the subsidiary area SA may be in contact with the electrodes RME1 and RME2 through the contact portions CT1 and CT2. The contact electrodes CNE1 and CNE2 may be disposed on a part the second bank BNL2 that may be disposed between the emission area EMA and the subsidiary area SA.

The first contact electrode CNE1 and the second contact electrode CNE2 may be disposed in a single sub-pixel PXn. The first contact electrode CNE1 and the second contact electrode CNE2 may be disposed on the first electrode RME1 and the second electrode RME2, respectively. Each of the first contact electrode CNE1 and the second contact electrode CNE2 may be extended in the first direction DR1, and they may form a linear pattern inside the emission area EMA of each of the sub-pixels PXn. The first contact electrode CNE1 may be in contact with the first electrode RME1 through the first contact portion CT1 exposing the upper surface of the first electrode RME1, and the second contact electrode CNE2 may be in contact with the second electrode RME2 through the second contact portion CT2 exposing the upper surface of the second electrode RME2. The first contact electrode CNE1 may be in contact with the first end of each of the light-emitting diodes ED, and the second contact electrode CNE2 may be in contact with the second end of each of the light-emitting diodes ED. The first contact electrode CNE1 and the second contact electrode CNE2 may transmit electric signals applied to the electrodes RME1 and RME2 to an end of each of the light-emitting diodes ED.

The contact portions CT1 and CT2 may be formed so that they do not overlap with the light-emitting diodes ED in the second direction DR2. The contact portions CT1 and CT2 may be formed such that they may be spaced apart in the first direction DR1 from the area where light-emitting diodes ED may be disposed. Lights may be emitted from the ends of the light-emitting diodes ED, and the contact portions CT1 and CT2 may be located to avoid the paths of the lights. According to an embodiment of the disclosure, the contact portions CT1 and CT2 may be formed in the subsidiary area SA where the light-emitting diodes ED may not be disposed. As the contact portions CT1 and CT2 may be formed in the subsidiary area SA, it may be possible to suppress that lights emitted from the light-emitting diodes ED may be refracted at the contact portions CT1 and CT2 and cannot exit. It may be possible to prevent that the light-emitting diodes ED stick together near the contact portions during the process of fabricating the display device 10 by the contact portions CT1 and CT2 exposing the upper surfaces of the electrodes RME1 and RME2.

The contact electrodes CNE1 and CNE2 may be disposed on the second passivation layer PAS2 such that they may be spaced apart from each other. They may be disposed on (e.g., directly on) the first passivation layer PAS1 and the light-emitting diodes ED where the second passivation layer PAS2 may not be disposed. It is, however, to be understood that the disclosure is not limited thereto. An additional insulating layer may be disposed between the contact electrodes CNE1 and CNE2, so that some parts of the contact electrodes CNE1 and CNE2 may be disposed on the same layer while other parts thereof may be disposed on different layers.

The contact electrodes CNE1 and CNE2 may include a conductive material. For example, the contact electrodes may include at least one of ITO, IZO, ITZO, aluminum (Al), or the like. For example, the contact electrodes CNE1 and CNE2 may include a transparent conductive material, and light emitted from the light-emitting diodes ED may transmit the contact electrodes CNE1 and CNE2 to propagate toward the electrodes RME1 and RME2. It is, however, to be understood that the disclosure is not limited thereto.

Although not shown in the drawings, an insulating layer may be further disposed on the contact electrodes CNE1 and CNE2 to cover the contact electrodes CNE1 and CNE2. The insulating layer may be disposed entirely on the first substrate SUB to protect the elements disposed thereon against the external environment.

As described above, the second passivation layer PAS2 covering the light-emitting diodes ED in the display device 10 may include the patterns PT. The patterns PT may cover the light-emitting diodes ED and may be arranged and spaced apart from one another in the first direction DR1, so that they can improve the light emission efficiency of lights exiting through the side surfaces of the light-emitting diodes ED.

Figure 6:
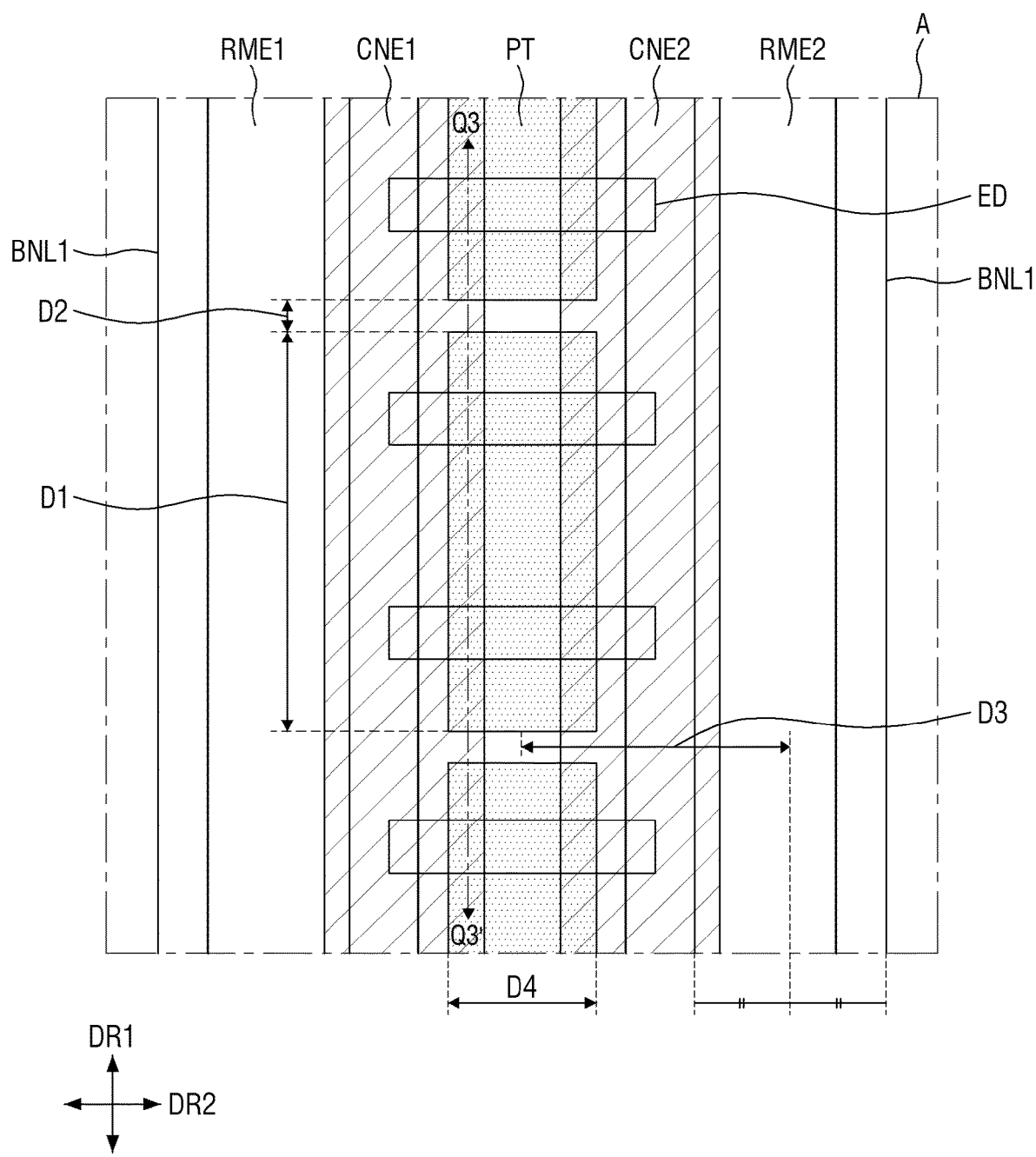
FIG. 6 is an enlarged schematic view of portion A of FIG. 3.
Figure 7:
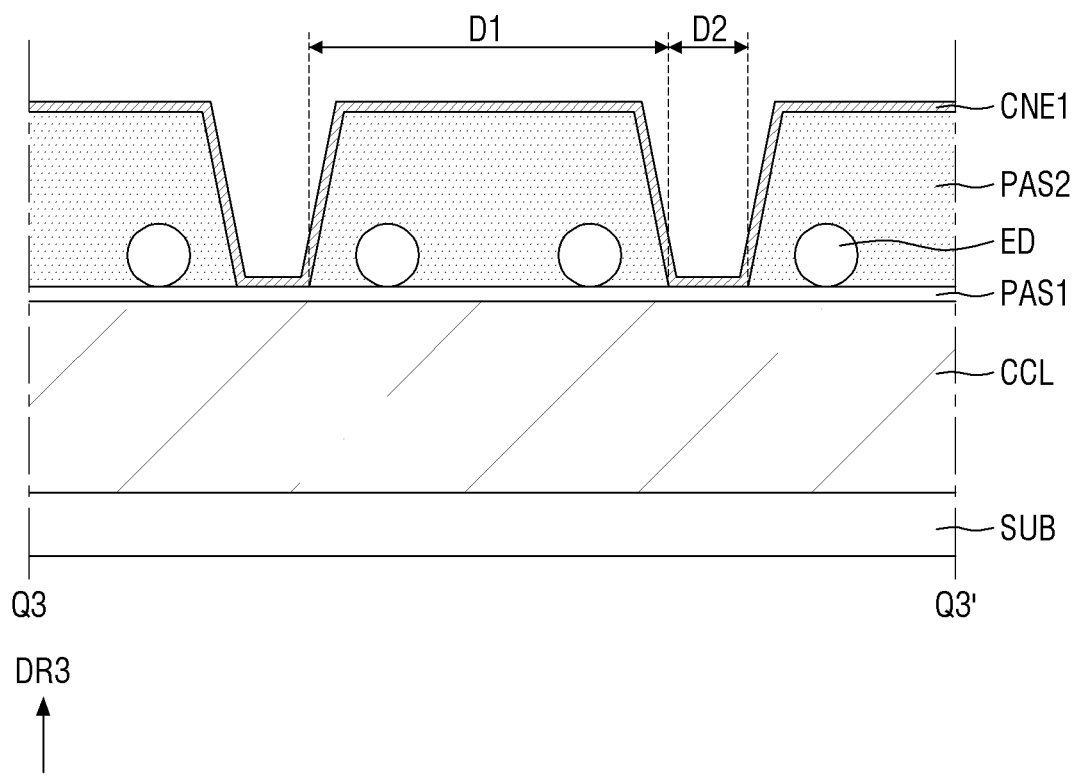
FIG. 7 is a schematic cross-sectional view taken along line Q3-Q3' of FIG. 6.

FIG. 6 is an enlarged schematic view of portion A of FIG. 3. FIG. 7 is a schematic cross-sectional view taken along line Q3-Q3' of FIG. 6. FIG. 6 is an enlarged view showing the arrangement of the patterns PT in FIG. 3. FIG. 7 shows a cross section traversing light-emitting diodes ED and patterns PT in the first direction DR1.

Referring to FIGS. 6 and 7 in addition to FIGS. 3 and 4, the second passivation layer PAS2 includes the patterns PT covering one or more light-emitting diodes ED, and the patterns PT may be spaced apart from one another in the first direction DR1 between the first banks BNL1. A single pattern PT may have a constant width in the second direction DR2. According to an embodiment of the disclosure, the width D4 of the pattern PT measured in the second direction DR2 may be smaller than the length of the light-emitting diodes ED. A single pattern PT may have the fourth width D4 so that it covers at least one light-emitting diode ED, with the ends of the light-emitting diode ED exposed. The width D4 of the pattern PT may be smaller than the distance between the first banks BNL1 and may be equal to or smaller than the distance between the first electrode RME1 and the second electrode RME2. It is, however, to be understood that the disclosure is not limited thereto.

The patterns PT may have a shape extended in the first direction DR1, and the patterns PT may be spaced apart from one another in the first direction DR1. Each of the patterns PT may cover one or more light-emitting diodes ED, and may be arranged and spaced apart from one another in the first direction DR1, similar to the light-emitting diodes ED. The ends of the light-emitting diodes ED under the patterns PT may be disposed on the electrodes RME1 and RME2, respectively, and no light-emitting diode ED may be disposed in the space between the patterns PT. According to an embodiment of the disclosure where the second passivation layer PAS2 includes an organic insulating material, the patterns PT may have a flat top surface. As the patterns PT may be made of an organic insulating material, even though the patterns PT cover one or more light-emitting diodes ED, their upper surfaces may be formed to be flat regardless of level differences thereunder.

The structure of the patterns PT of the second passivation layer PAS2 may be formed by forming a single pattern covering all of the light-emitting diodes ED and then cutting the pattern at regular intervals. The second passivation layer PAS2 may be formed in a single pattern during the process of fabricating the display device 10 and may serve to fix the light-emitting diodes ED. The second passivation layer PAS2 covering the light-emitting diodes ED may guide the light emitted through the side surfaces of the light-emitting diodes ED to propagate. If the second passivation layer PAS2 may be formed in a single pattern extended in the first direction DR1 and the length may be too long, light emitted through the side surfaces of the light-emitting diodes ED may travel along the second passivation layer PAS2 and may be absorbed by the second passivation layer PAS2 or lost at the boundary between the second passivation layer PAS2 and the outside. As a result, light emission efficiency may be reduced. In contrast, in the display device 10 according to an embodiment of the disclosure, the second passivation layer PAS2 may include multiple patterns PT spaced apart from one another in the first direction DR1, and the length of the patterns PT in the first direction DR1 can be adjusted. As a result, it may be possible to reduce the travel distance or propagation length of the light emitted through the side surfaces of the light-emitting diodes ED. During the process of fabricating the display device 10, the patterns PT may be formed by forming as a single pattern extended in a direction and then separating it into multiple patterns. As the patterns PT may have a shape extended in the first direction DR1 with the length relatively short, the amount of light that may be emitted from the light-emitting diodes ED and absorbed by the patterns PT can be reduced. Light emitted from the light-emitting diodes ED can exit through the patterns PT, so that the light emission efficiency of the display device 10 can be improved.

The length D1 of each of the patterns PT measured in the first direction DR1 may have a range sufficient to cover one or more light-emitting diodes ED. Specifically, the length D1 of each of the patterns PT measured in the first direction DR1 may be at least larger than the diameter of the light-emitting diodes ED. If the length D1 of each of the patterns PT measured in the first direction DR1 may be too small, the light-emitting diodes ED cannot be fixed. If the length D1 may be too long, the light emitted from the light-emitting diodes ED may be absorbed, and thus the light emission efficiency may be lowered.

The length of each of the patterns PT measured in the first direction DR1 may be determined based on the amount of light exiting in the first direction DR1 and the light exiting in the second direction DR2 from the light-emitting diodes ED. As mentioned earlier, lights can exit from the light-emitting diodes ED not only through the side surfaces but also the first end and the second ends in the longitudinal direction. The light exiting through the ends of the light-emitting diodes ED may be reflected by the electrodes RME1 and RME2 disposed on the side surfaces of the first banks BNL1 to exit upward. Lights emitted from the light-emitting diodes ED in the second direction DR2 may propagate through the contact electrodes CNE1 and CNE2 and the first passivation layer PAS1. The travel distance or propagation distance of such lights may be determined based on the distance between the second passivation layer PAS2 and the first banks BNL1.

The propagation distance of the light emitted through the side surfaces of the light-emitting diodes ED and traveling in the first direction DR1 may be determined based on the length D1 of each of the patterns PT in the first direction DR1. The propagation distance of the light emitted through the ends of the light-emitting diodes ED and traveling in the second direction DR2 may be determined based on the distance D3 between the center of the second passivation layer PAS2 and the center of the first banks BNL1. According to an embodiment of the disclosure, the length D1 of each of the patterns PT measured in the first direction DR1 may be equal to or greater than a distance D3 between the center of the second passivation layer PAS2 and the center of the first banks BNL1. By adjusting the length D1 of each of the patterns PT measured in the first direction DR1, it may be possible to reduce an error in the light emission ratio between the first direction DR1 and the second direction DR2 of the light-emitting diodes ED of the display device 10.

The distance D2 between the patterns PT may be smaller than the length D1 of each of the patterns PT measured in the first direction DR1. The distance D2 between the patterns PT may have a size equal to or greater than a predetermined size depending on the resolution of the patterning process. However, if it may be too large, the number of light-emitting diodes ED lost between the patterns PT may increase. The distance D3 between the patterns PT may have a minimum size in consideration of the loss rate of the light-emitting diodes ED, and may have a minimum value depending on the resolution of the patterning process.

Parts of the contact electrodes CNE1 and CNE2 may be disposed on the patterns PT of the second passivation layer PAS2. As the contact electrodes CNE1 and CNE2 may have a shape extended in the first direction DR1, they may be disposed even between the patterns PT spaced apart from one another. According to an embodiment of the disclosure, the parts of the contact electrodes CNE1 and CNE2 that may be disposed between the patterns PT may be disposed on (e.g., directly on) the first passivation layer PAS1. The contact electrodes CNE1 and CNE2 may surround and may be in contact with an end of the light-emitting diodes ED, and may be extended in a direction. A part of each of the contact electrodes CNE1 and CNE2 that may be adjacent in the first direction DR1 to the part thereof in contact with the light-emitting diodes ED may be disposed on (e.g., directly on) the first passivation layer PAS1. Likewise, a part thereof that may be adjacent to the part disposed on the patterns PT may also be disposed on (e.g., directly on) the first passivation layer PAS1. It is, however, to be understood that the disclosure is not limited thereto.

In the display device 10 according to an embodiment, the second passivation layer PAS2 fixing the light-emitting diodes ED may include multiple patterns PT. As the patterns PT may fix the light-emitting diodes ED and may be arranged and spaced apart from one another in the first direction DR1, the light emission efficiency of lights emitted from the light-emitting diodes ED can be improved.

Although the second passivation layer PAS2 may include the patterns PT to cover the light-emitting diodes ED only in the above-described embodiments, it is to be noted that the disclosure is not limited thereto. In some embodiments, the second passivation layer PAS2 may include patterns PT that may be disposed entirely on the first passivation layer PAS1 to expose both ends of the light-emitting diodes ED and may be spaced apart from one another. That is to say, the second passivation layer PAS2 may further include parts disposed on the electrodes RME1 and RME2 or the second bank BNL2. More detailed description thereon will be given with reference to another embodiment.

Figure 8:
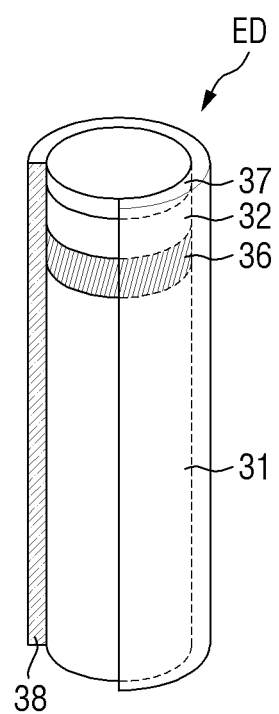
FIG. 8 is a schematic view showing a light-emitting element according to an embodiment of the disclosure.

FIG. 8 is a schematic view showing a light-emitting diode according to an embodiment of the disclosure.

Referring to FIG. 8, a light-emitting element may be a light-emitting diode ED. Specifically, the light-emitting element may have a size from nanometers to micrometers and may be an inorganic light-emitting diode made of an inorganic material. The light-emitting diode ED may be aligned between two electrodes facing each other as polarities may be created by forming an electric field in a particular direction between the two electrodes.

The light-emitting diode ED according to an embodiment may have a shape extended in a direction. The light-emitting diode ED may have a shape of a cylinder, a rod, a wire, a tube, etc. It is to be understood that the shape of the light-emitting diode ED is not limited thereto. The light-emitting diode ED may have a variety of shapes including a polygonal column shape such as a cube, a cuboid and a hexagonal column, or a shape that may be extended in a direction with partially inclined outer surfaces.

The light-emitting diode ED may include semiconductor layers doped with impurities of a conductive type (e.g., p-type or n-type). The semiconductor layers may emit light of a certain wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The n-type dopant doped into the first semiconductor layer 31 may be at least one of Si, Ge, Sn, or the like. A first end of the light-emitting diode ED may refer to the side of the emissive layer 36 where the first semiconductor layer 31 may be disposed.

The second semiconductor layer 32 may be disposed above the first semiconductor layer 31 with the emissive layer 36 therebetween. The second semiconductor layer 32 may be a p-type semiconductor. The second semiconductor layer 32 may include a semiconductor material having the following chemical formula: $Al_xGa_yIn_{1-x-y}N$ ($0 \le x \le 2$, $0 \le y \le 1$, $0 \le x+y \le 1$). For example, it may be at least one of p-type doped AlGaInN, GaN, AlGaN, InGaN, AlN and InN. The p-type dopant doped into the second semiconductor layer 32 may be at least one of Mg, Zn, Ca, Se, Ba, etc. A second end of the light-emitting diode ED may refer to the other side of the emissive layer 36 where the second semiconductor layer 32 may be disposed.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs may be combined therein in response to an electrical signal applied through the first semiconductor layer 31 and the second semiconductor layer 32. The emissive layer 36 may include a material such as AlGaN and AlGaInN. In particular, when the emissive layer 36 has a multi-quantum well structure in which quantum layers and well layers may be alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic contact electrode. It is, however, to be understood that the disclosure is not limited thereto. The element electrode layer may be Schottky contact electrodes. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting diode ED and the electrodes or the contact electrodes when the light-emitting diode ED is electrically connected to the electrodes or the contact electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 may be disposed to surround the outer surfaces of the semiconductor layers and electrode layers described above. For example, the insulating film 38 may be disposed to surround at least the outer surface of the emissive layer 36, with both ends of the light-emitting diode ED in the longitudinal direction exposed. A part of the upper surface of the insulating film 38 may be rounded in cross section, which may be adjacent to at least one of the ends of the light-emitting diode ED.

The insulating film 38 may include materials having insulating properties such as silicon oxide (SiOx), silicon nitride (SiNx), silicon oxynitride (SiOxNy), aluminum nitride (AlNx), aluminum oxide (AlOx), or a combination thereof. Although the insulating film 38 is formed as a single layer in the drawings, the disclosure is not limited thereto. In some embodiments, the insulating film 38 may be formed as a multilayer structure in which multiple layers may be stacked on one another.

The insulating film 38 may serve to protect the above-described elements. The insulating film 38 can prevent an electrical short-circuit that may occur in the emissive layer 36 if it comes in direct contact with an electrode through which an electric signal may be transmitted to the light-emitting diode ED. The insulating film 38 can prevent a decrease in luminous efficiency.

The outer surface of the insulating film 38 may be subjected to surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

Hereinafter, display devices according to other embodiments of the disclosure will be described with reference to other drawings.

Figure 9:
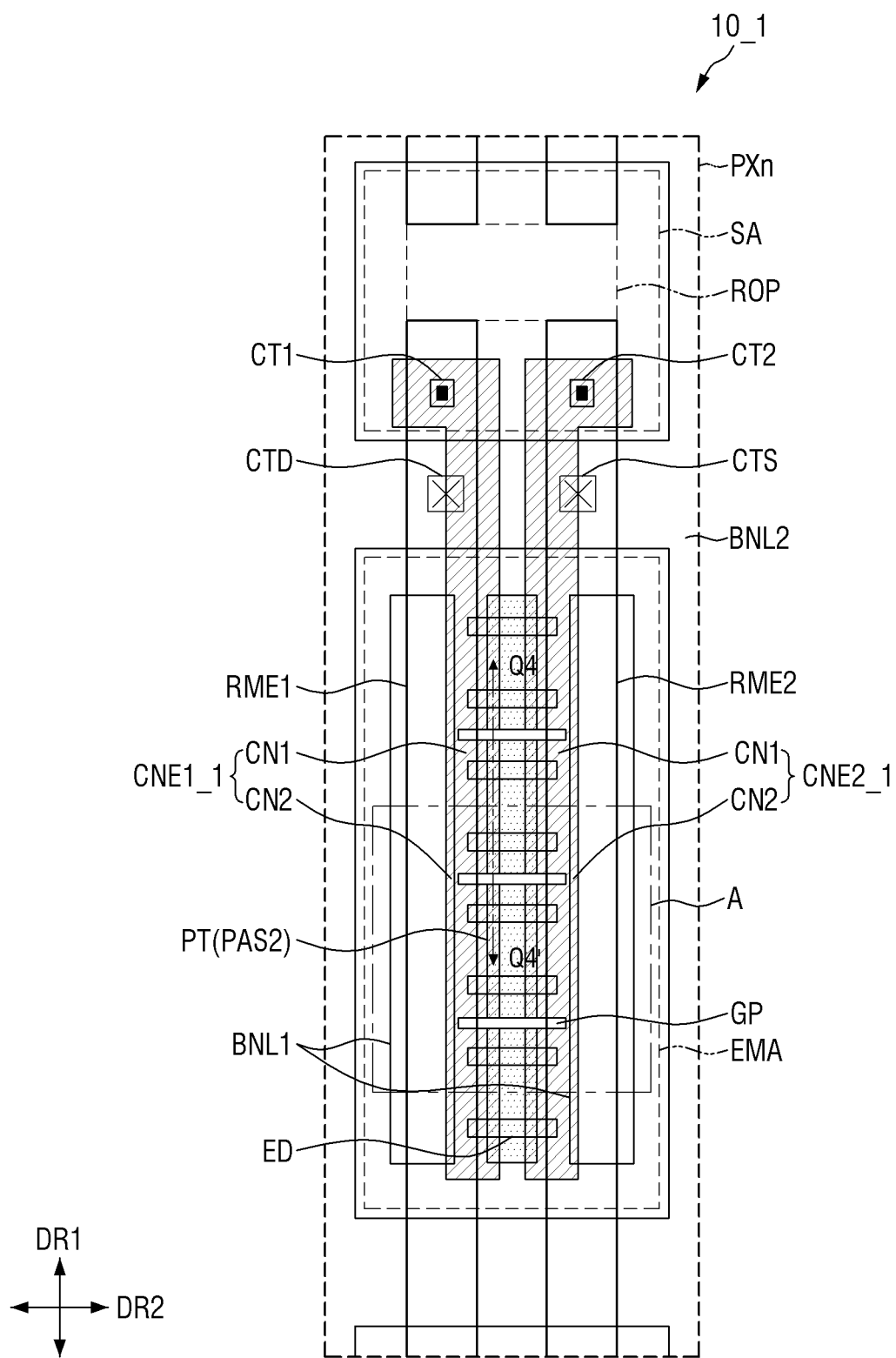
FIG. 9 is a schematic plan view showing a sub-pixel of a display device according to another embodiment of the disclosure.
Figure 10:
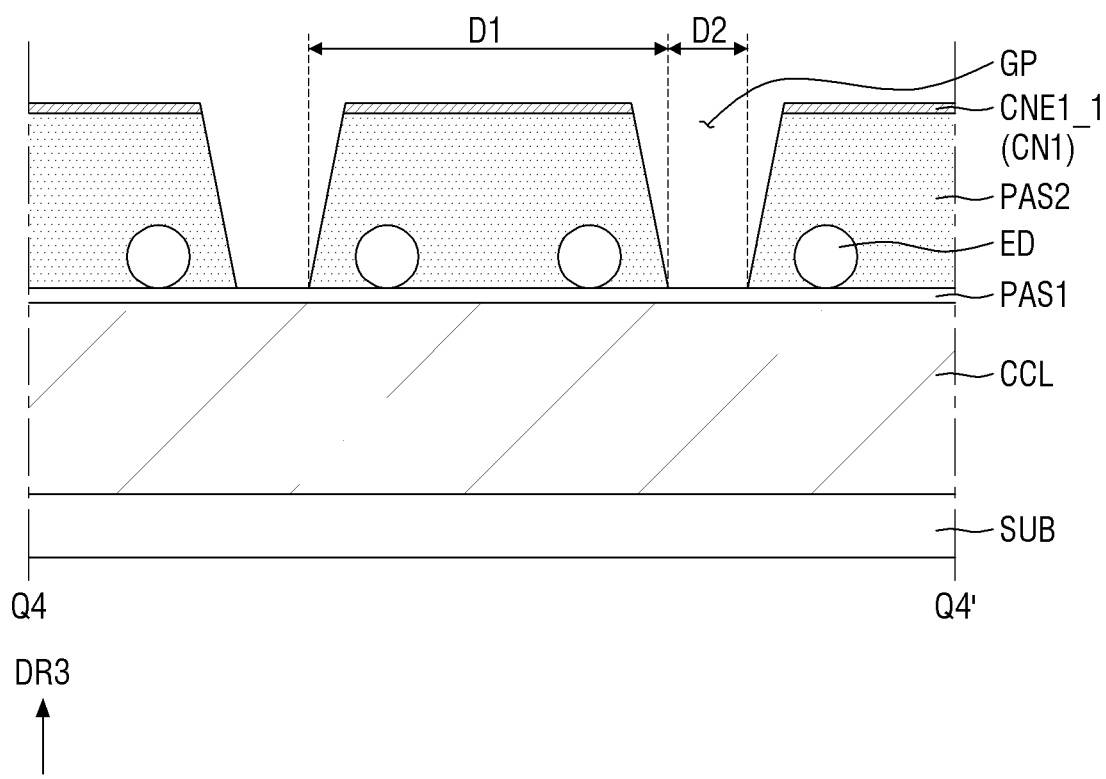
FIG. 10 is a schematic cross-sectional view taken along line Q4-Q4' of FIG. 9.

FIG. 9 is a schematic plan view showing a sub-pixel of a display device according to another embodiment of the disclosure. FIG. 10 is a schematic cross-sectional view taken along line Q4-Q4' of FIG. 9. FIG. 10 shows a cross section traversing light-emitting diodes ED and patterns PT in the first direction DR1.

Referring to FIGS. 9 and 10, in a display device 10_1 according to an embodiment, the contact electrodes CNE1_1 and CNE2_1 may be partially patterned along with the patterns PT of the second passivation layer PAS2 that may be spaced apart from one another. The contact electrodes CNE1_1 and CNE2_1 of the display device 10_1 may include first electrode portions CN1 partially disposed over the patterns PT, and second electrode portions CN2 disposed between the first electrode portions CN1 and located between the patterns PT. The process of forming the patterns PT of the second passivation layer PAS2 may be performed after forming the contact electrodes CNE1_1 and CNE2_1. The contact electrodes CNE1_1 and CNE2_1 may be partially patterned during the process of forming the patterns PT so that they may be divided into the first electrode portions CN1 and the second electrode portions CN2.

The first electrode portions CN1 of the contact electrodes CNE1_1 and CNE2_1 may correspond to the patterns PT and may be in contact with the light-emitting diodes ED and the patterns PT with a constant width. The side of the first electrode portions CN1 of the first contact electrode CNE1_1 that faces the second contact electrode CNE2_1 may be disposed on the patterns PT. The side of the first electrode portions CN1 of the second contact electrode CNE2_1 that faces the first contact electrode CNE1_1 may be disposed on the patterns PT. Since the first electrode portions CN1 may be formed via the same process as the patterns PT, the length measured in the first direction DR1 may be equal to the length of each of the patterns PT measured in the first direction DR1. According to an embodiment of the disclosure, the distance between the first electrode portions CN1 in the first direction DR1 may be equal to the distance between the patterns PT in the first direction DR1.

The second electrode portions CN2 of the contact electrodes CNE1_1 and CNE2_1 may be located between the patterns PT, and may have a width smaller than that of the first electrode portions CN1. The second electrode portions CN2 may be the residues of the material of the contact electrodes CNE1_1 and CNE2_1 after they may be patterned during a process of forming the patterns PT, which may be located between the first electrode portions CN1. The material of the contact electrodes CNE1_1 and CNE2_1 may be removed between the second electrode portions CN2 of the first contact electrode CNE1_1 and the second contact electrode CNE2_1, such that slits GP may be formed. Since the second electrode portions CN2 may be located in the space between the patterns PT, they may be spaced apart from the patterns PT.

The contact electrodes CNE1_1 and CNE2_1 may be formed to have sides that face each other and are bent along the first direction DR1. The distance between the first electrode portions CN1 of each of the contact electrodes CNE1_1 and CNE2_1 may be smaller than the distance between the second electrode portions CN2.

As the contact electrodes CNE1_1 and CNE2_1 may have the first electrode portions CN1 and the second electrode portions CN2, none of the contact electrodes CNE1_1 and CNE2_1 may be disposed on the first passivation layer PAS1 exposed between the patterns PT. As shown in FIG. 10, the sides of the patterns PT in the first direction DR1 may be exposed without the contact electrodes CNE1_1 and CNE2_1 disposed thereon. The lights emitted through the side surfaces of the light-emitting diodes ED may be incident on the patterns PT and may exit through the boundary between the patterns PT and the outside. In the display device 10_1 according to the embodiment, since the contact electrodes CNE1_1 and CNE2_1 may not be disposed on the sides of the patterns in the first direction DR1 but the sides may be exposed, it may be possible to reduce the amount of light reflected at the boundary formed by the patterns PT and the contact electrodes CNE1_1 and CNE2_1 among the light exiting through the side surfaces of the light-emitting diodes ED. That is to say, the light emission efficiency of the display device 10_1 can be further improved by partially patterning the contact electrodes CNE1_1 and CNE2_1.

Figure 11:
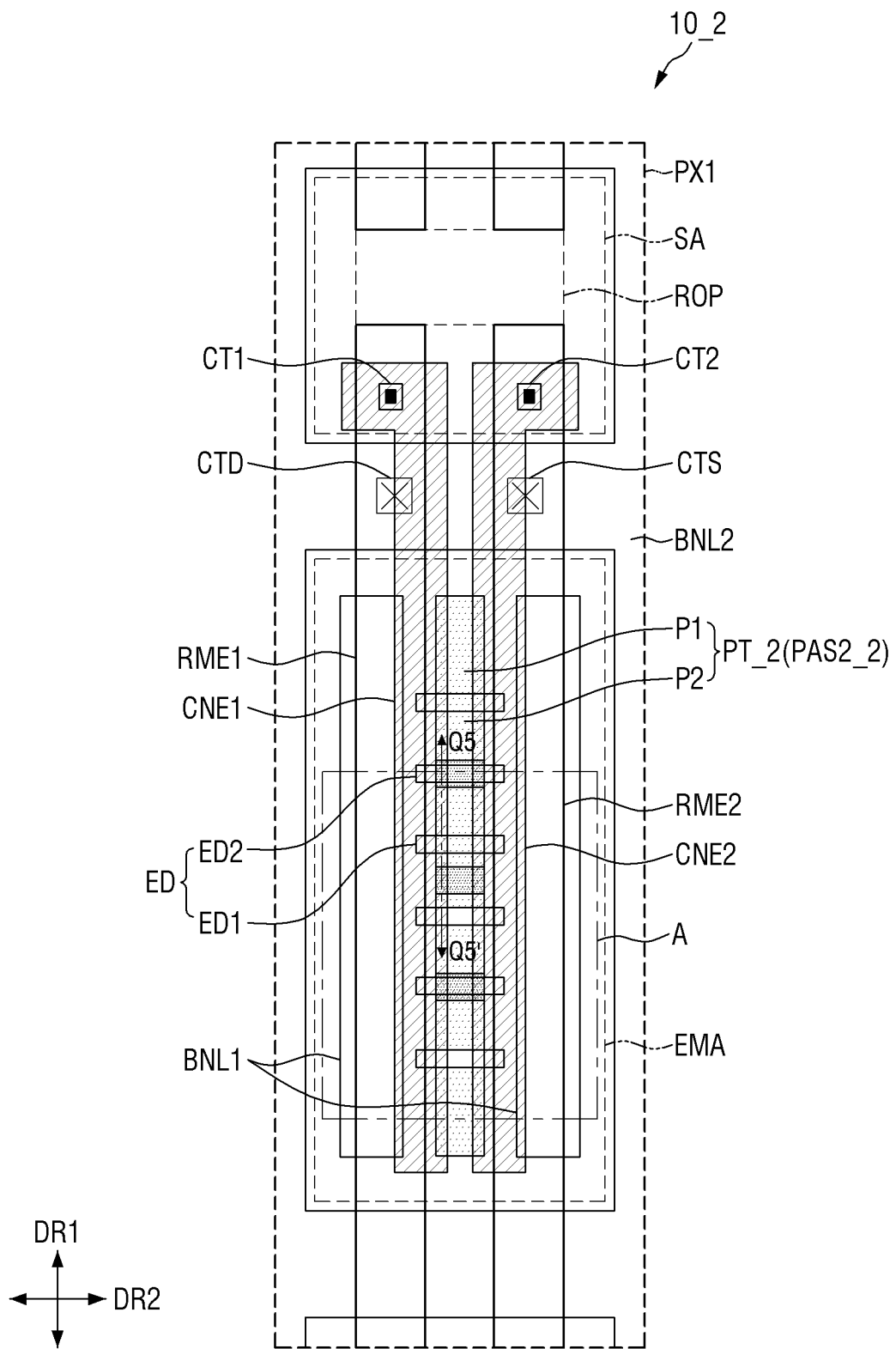
FIG. 11 is a schematic plan view showing a sub-pixel of a display device according to another embodiment of the disclosure.
Figure 12:
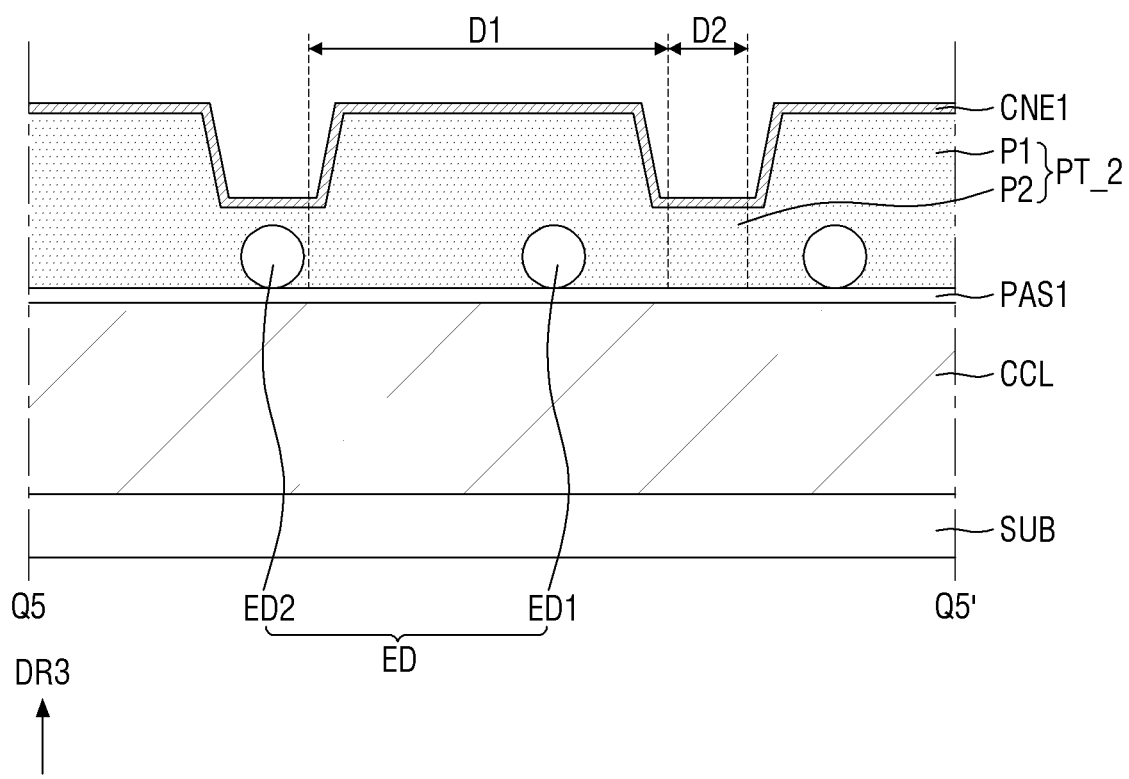
FIG. 12 is a schematic cross-sectional view taken along line Q5-Q5' of FIG. 11.

FIG. 11 is a schematic plan view showing a sub-pixel of a display device according to another embodiment of the disclosure. FIG. 12 is a schematic cross-sectional view taken along line Q5-Q5' of FIG. 11. FIG. 12 shows a cross section traversing light-emitting diodes ED and a pattern PT_2 in the first direction DR1.

Referring to FIGS. 11 and 12, in a display device 10_2 according to an embodiment, a second passivation layer PAS2_2 may include a single pattern PT_2 extended in the first direction DR1, including first portions P1 and second portions P2 having different thicknesses. The pattern PT_2 of the second passivation layer PAS2_2 may be formed as a single pattern and disposed to cover the light-emitting diodes ED, with the upper surface having different levels. Accordingly, it can allow the light to exit due to the upper surface having different levels.

The pattern PT_2 may be extended between the first banks BNL1 in the first direction DR1 and may be disposed to cover the light-emitting diodes ED. Parts of the upper surface of the pattern PT_2 may be depressed, and thus the pattern PT_2 may include portions having different thicknesses. According to an embodiment of the disclosure, the pattern PT_2 may include the first portions P1 having a first thickness and the second portions P2 having a second thickness smaller than the first thickness. Unlike the embodiment of FIG. 3, the pattern PT_2 may be formed by partially patterning the upper surface during the process of fabricating the display device 10_2, instead of completely removing the upper surface. Parts of the pattern PT_2 that may not be patterned and have the first thickness may form the first portions P1, whereas parts of the pattern PT_2 that have been patterned and have the second thickness, which may be lower, may form the second portions P2. The second portions P2 may be identical to the first portions P1 except for their thickness. Each of the first portions P1 and the second portions P2 may have a flat upper surface.

According to an embodiment of the disclosure, the light-emitting diodes ED may include first light-emitting diodes ED1 disposed under the first portions P1 of the pattern PT_2, and second light-emitting diodes ED2 disposed under the second portions P2. In the display device 10 of FIG. 3, no light-emitting diode ED may be disposed between the patterns. In contrast, in the display device 10_2 of FIGS. 11 and 12, the second portions P2 of the pattern PT_2 has a certain width, and thus the second light-emitting diodes ED2 may be disposed thereunder. The first light-emitting diodes ED1 as well as the second light-emitting diodes ED2 may be covered by the pattern PT_2, but the thickness of the pattern PT_2 disposed on the first light-emitting diodes ED1 may be different from that of the pattern PT_2 disposed on the second light-emitting diodes ED2. Since the arrangement of the light-emitting diodes ED may not be aligned with the positions of the first and second portions P1 and P2 of the pattern PT_2, the light-emitting diodes ED may not be disposed under some of the second portions P2 of the pattern PT_2.

Incidence angles of lights emitted through the side surfaces of the light-emitting diodes ED to be incident toward the outer surface of the pattern PT_2 may be changed due to the level difference formed by the first portions P1 and the second portions P2. At least some of the lights emitted through the side surfaces of the light-emitting diodes ED may be incident on the side surfaces of the first portions P1 or may be incident on the upper surfaces of the second portions P2. The lights incident on the side surfaces of the first portions P1 or the upper surfaces of the second portions P2 may have different incidence angles from the incidence angle of the light directed toward the upper surfaces of the first portions P1. The lights may travel in the pattern PT_2 having the same refractive index, but some of the lights may exit as they have different incidence angles at the interface with the outside. In other words, the pattern PT_2 includes the first portions P1 and the second portions P2 having different thicknesses, to allow light to exit due to the level difference.

Figure 13:
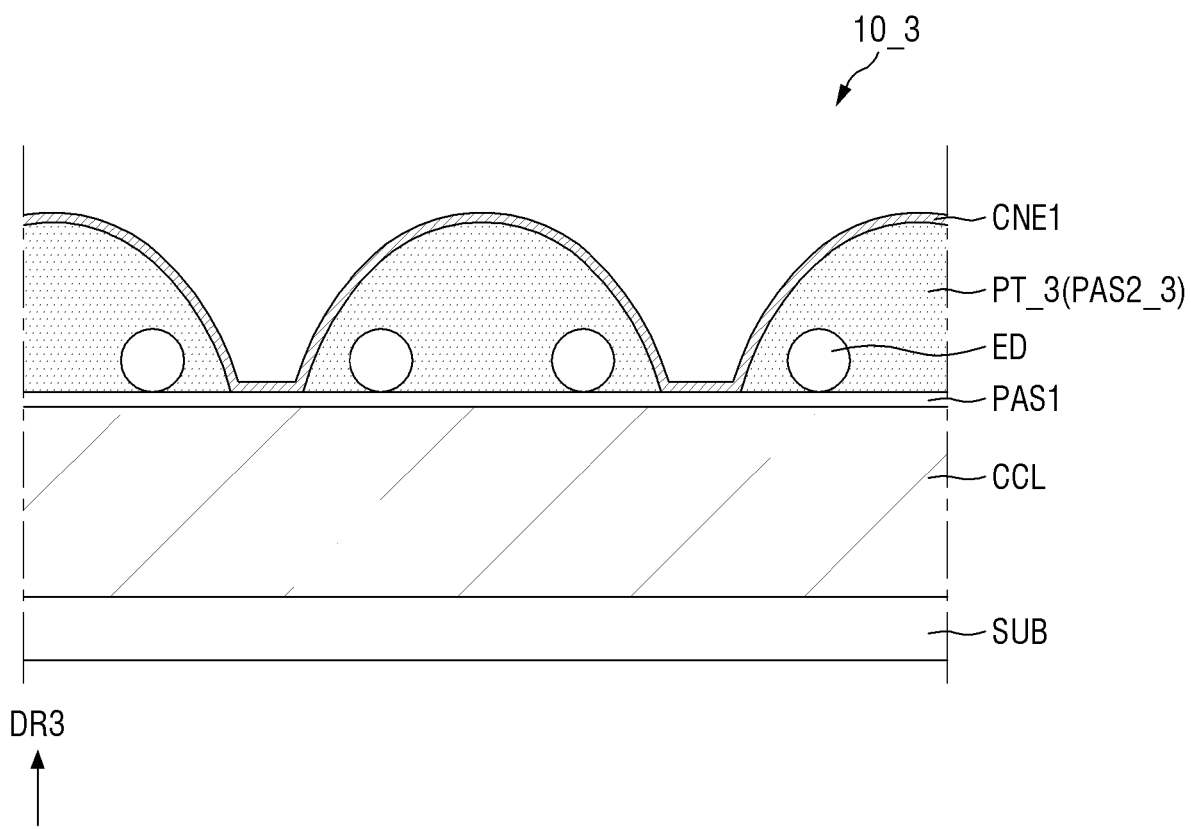
FIG. 13 is a schematic cross-sectional view showing a part of a display device according to another embodiment of the disclosure.

FIG. 13 is a schematic cross-sectional view showing a part of a display device according to another embodiment of the disclosure.

Referring to FIG. 13, in a display device 10_3 according to an embodiment of the disclosure, patterns PT_3 of a second passivation PAS2_3 may have curved surfaces. This embodiment may be different from the embodiment of FIG. 7 in that the cross sectional shape of the patterns PT_3 may be different. In the following description, descriptions will focus on the difference, and the redundant descriptions will be omitted.

In an embodiment where the second passivation layer PAS2_3 includes an organic insulating material, upper surfaces of the patterns PT_3 may not be flat and may have a curved shape. The patterns PT_3 of the second passivation layer PAS2_3 may be formed by partially patterning the second passivation layer PAS2_3 during the process of fabricating the display device 10_3 to form the same structure as in the embodiment of FIG. 7, and then performing heat treatment on the second passivation layer PAS2_3.

Figure 14:
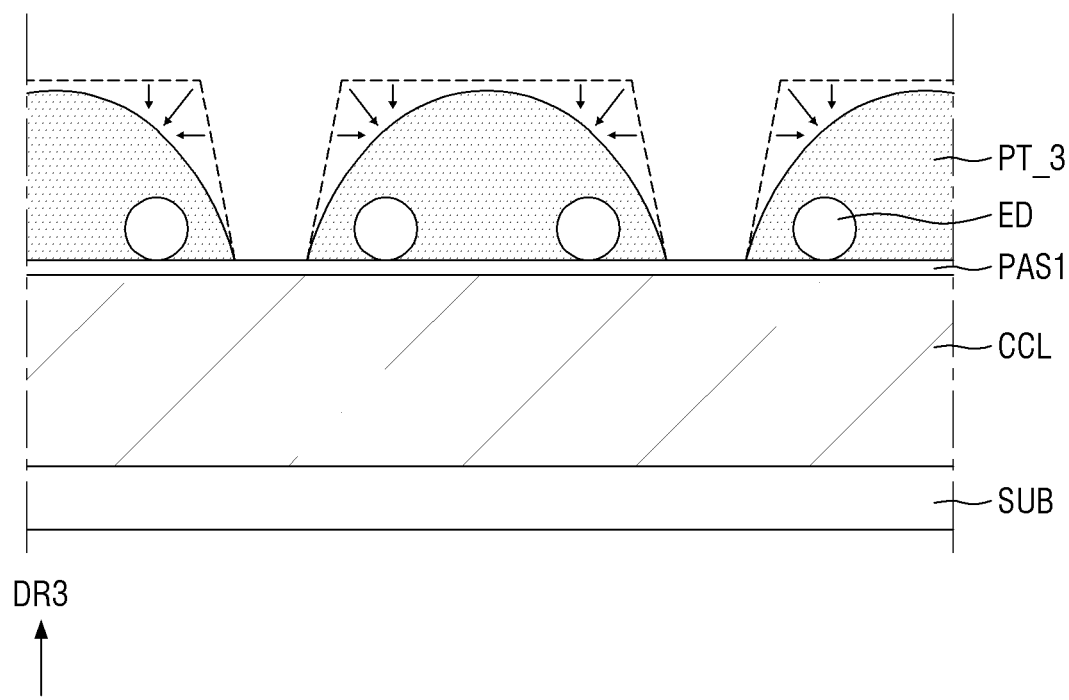
FIG. 14 is a schematic cross-sectional view showing a processing step during the process of fabricating the display device of FIG. 13.

FIG. 14 is a schematic cross-sectional view showing a processing step during the process of fabricating the display device of FIG. 13.

Referring to FIG. 14, patterns PT_3 including an organic insulating material may be partially melted via a heat treatment process so that they have fluidity, and thus they may be reflowed. After the above-described process, the organic insulating material may be cured, and thus the patterns PT_3 can have a curved shape, instead of a flat upper surface.

As the upper surfaces of the patterns PT_3 may not be flat but have a curved shape, the incidence angle of lights directed toward the upper surfaces of the patterns PT_3 among the lights emitted through the side surfaces of the light-emitting diodes ED may be changed. Similar to the embodiment of FIG. 12, according to this embodiment, the shape of the upper surfaces of the patterns PT_3 in the display device 10_3 may be modified to allow the light emitted from the light-emitting diodes ED to exit. That is to say, the light emission efficiency of the light-emitting diodes ED of the display device 10_3 can be further improved.

Figure 15:
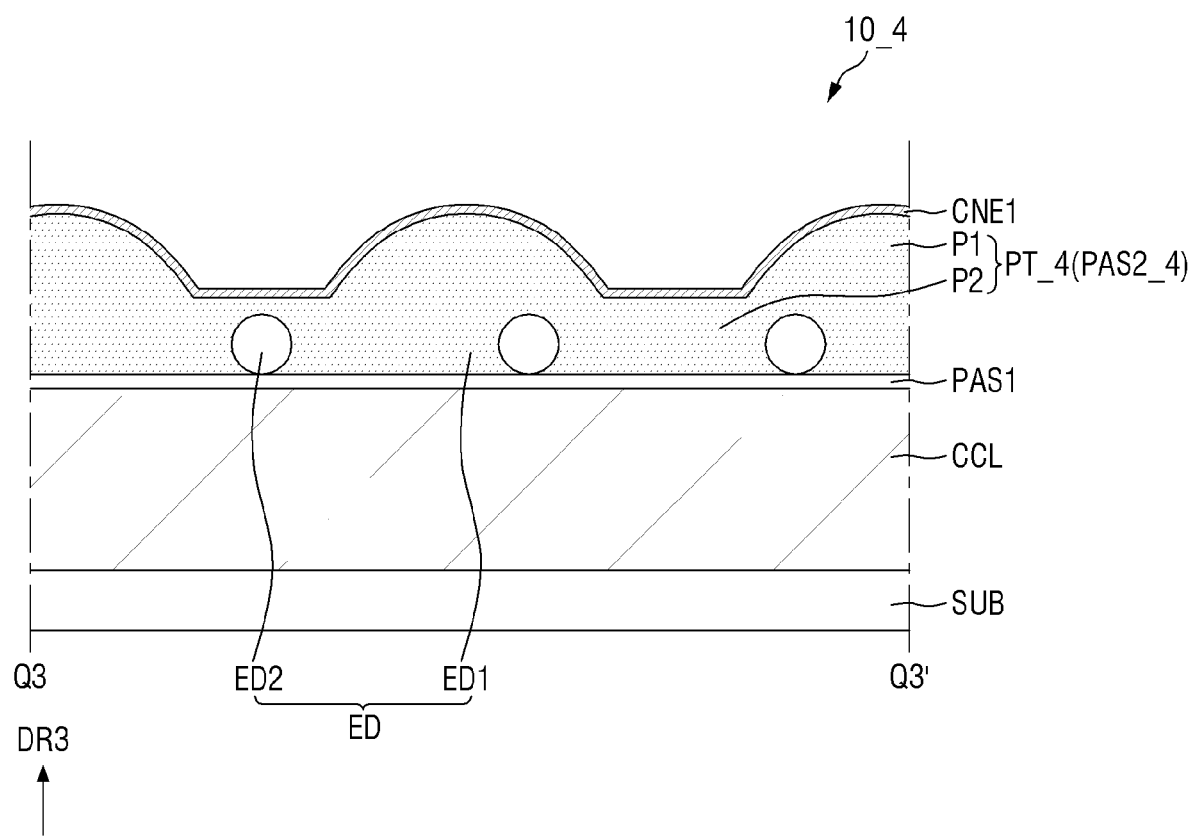
FIG. 15 is a schematic cross-sectional view showing a part of a display device according to another embodiment of the disclosure.

FIG. 15 is a schematic cross-sectional view showing a part of a display device according to another embodiment of the disclosure.

Referring to FIG. 15, in a display device 10_4 according to an embodiment, a pattern PT_4 of a second passivation layer PAS2_4 includes first portions P1 and second portions P2 having different thicknesses, and the upper surfaces of the first portions P1 may have a curved shape while the upper surfaces of the second portions P2 may have a flat shape. This embodiment may be different from the embodiment of FIG. 12 in that the shape of the upper surfaces of the first portions P1 may be similar to that of the embodiment of FIG. 13. In the display device 10_4, the second passivation layer PAS2_4 may include the single pattern PT_4 but the pattern PT_4 may include the portions P1 and P2 having different thicknesses with the curved upper surfaces. Accordingly, the light emission efficiency can be improved.

Figure 16:
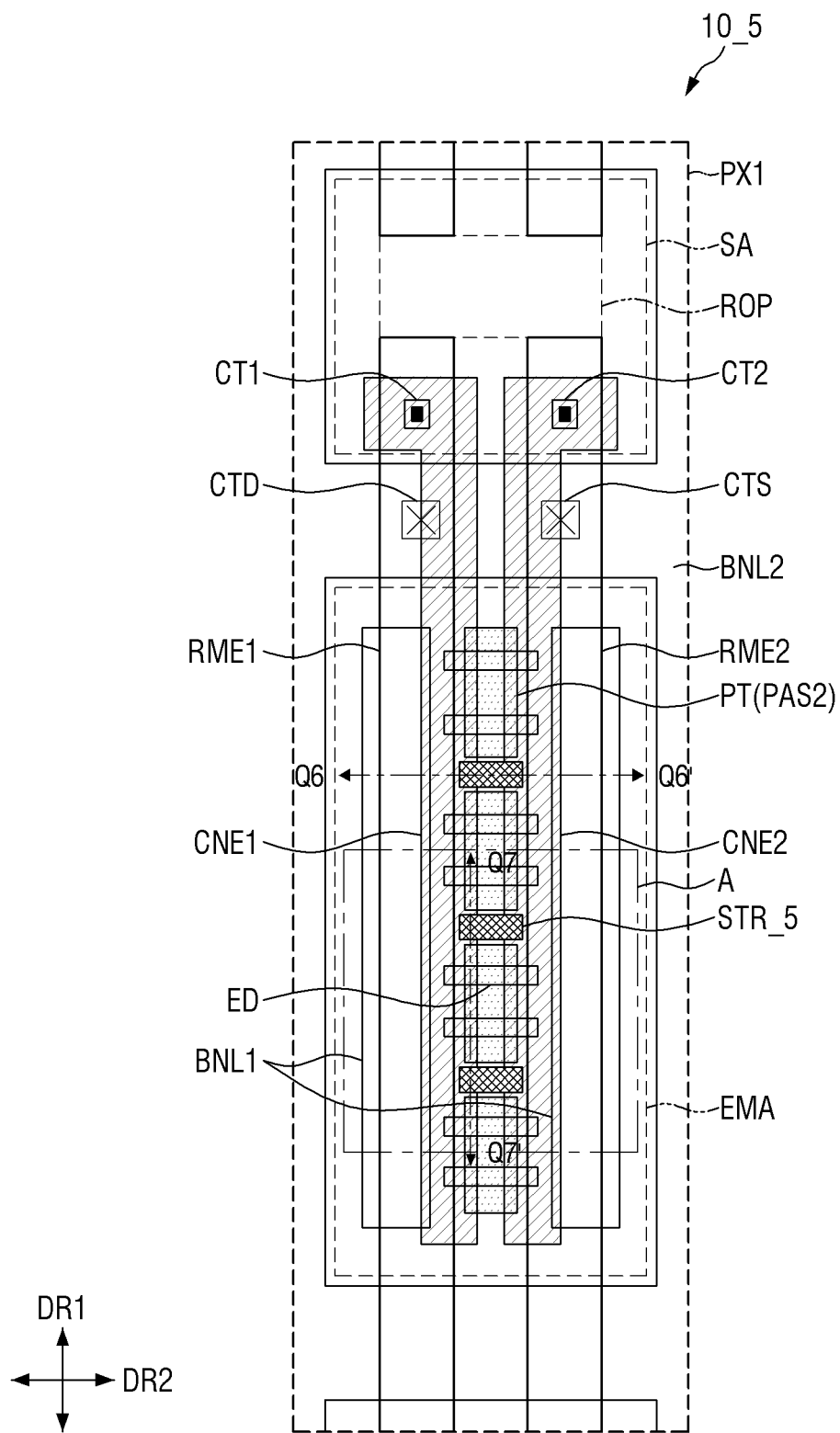
FIG. 16 is a schematic plan view showing a sub-pixel of a display device according to another embodiment of the disclosure.
Figure 17:
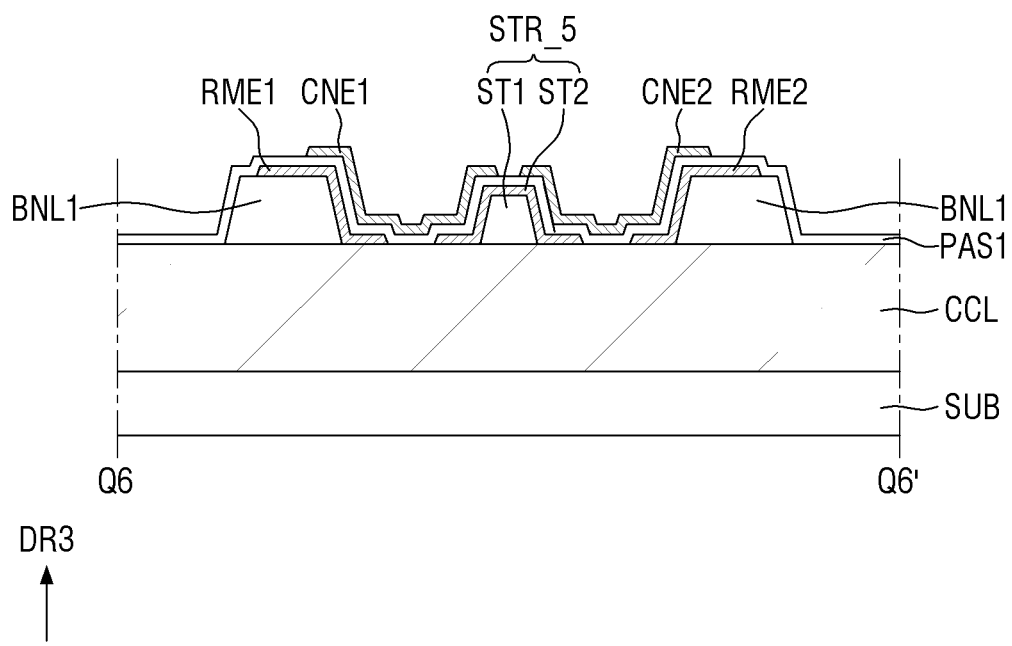
FIG. 17 is a schematic cross-sectional view taken along line Q6-Q6' of FIG. 16.
Figure 18:
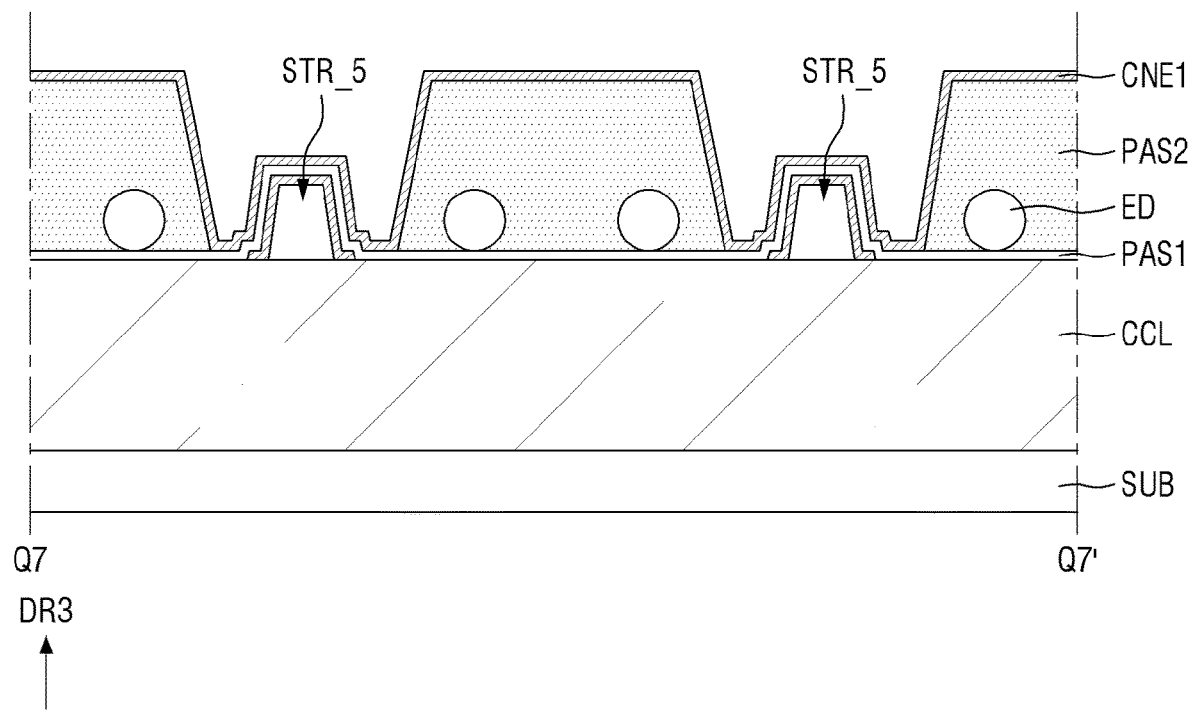
FIG. 18 is a schematic cross-sectional view taken along line Q7-Q7' of FIG. 16.

FIG. 16 is a schematic plan view showing a sub-pixel of a display device according to another embodiment of the disclosure. FIG. 17 is a schematic cross-sectional view taken along line Q6-Q6' of FIG. 16. FIG. 18 is a schematic cross-sectional view taken along line Q7-Q7' of FIG. 16. FIG. 17 shows a cross section traversing a structure STR_5 of a display device 10_5 in the second direction DR2. FIG. 18 shows a cross section traversing structures STR_5 and light-emitting diodes ED in the first direction DR1.

Referring to FIGS. 16 to 18, the display device 10_5 according to an embodiment may further include structures STR_5 disposed between patterns PT of a second passivation layer PAS2 spaced apart from one another. The structures STR_5 may be located between the patterns PT depending on the arrangement of the patterns PT. The structures STR_5 can guide the light-emitting diodes ED so that they may be arranged at particular locations and can improve the light emission efficiency of lights exiting through the side surfaces of the light-emitting diodes ED.

The structures STR_5 may be disposed between the first electrode RME1 and the second electrode RME2. The structure STR_5 may be disposed on a via layer VIA and disposed on the same layer as the electrodes RME1 and RME2. According to an embodiment of the disclosure, the structure STR_5 may be disposed between the first electrode RME1 and the first passivation layer PAS1 between the first substrate SUB and the first passivation layer PAS1 or between the via layer VIA and the first passivation layer PAS1. The width of the structure STR_5 measured in the second direction DR2 may be smaller than the distance between the first electrode RME1 and the second electrode RME2. The structures STR_5 may not be in direct contact with the electrodes RME1 and RME2 by the first passivation layer PAS1.

The structures STR_5 may be spaced apart from one another in the first direction DR1 between the electrodes RME1 and RME2. As the structures STR_5 may be disposed in the space between the patterns PT of the second passivation layer PAS2, they may not overlap with the patterns PT in the thickness direction. During the process of fabricating the display device 10_5, the structures STR_5 may be formed before the first passivation layer PAS1 may be disposed, and the patterns PT may be formed by patterning the parts where the structures STR_5 may be disposed.

The structure STR_5 may have a shape protruding upward from the upper surface of the first substrate SUB or the via layer VIA. The structures STR_5 may define a space in the first direction DR1 between the electrodes RME1 and RME2. The upper surface of the first passivation layer PAS1 may have level differences along the first direction DR1. The first passivation layer PAS1 may have a low height between the structures STR_5 spaced apart from one another. The light-emitting diodes ED may be disposed between the structures STR_5. It is, however, to be understood that the disclosure is not limited thereto.

According to an embodiment of the disclosure, the structure STR_5 may include a bottom layer ST1 and an upper layer ST2 disposed to cover the bottom layer ST1. The bottom layer ST1 may have a shape protruding from the upper surface of the via layer VIA. In some embodiments, the bottom layer ST1 may include the same material as the first bank BNL1 and may have inclined side surfaces. It is, however, to be understood that the disclosure is not limited thereto.

The upper layer ST2 may be disposed to cover the outer surface of the bottom layer ST1. In some embodiments, the upper layer ST2 may include a material having high reflectivity, and may include the same material as the electrodes RME1 and RME2 or the contact electrodes CNE1 and CNE2. The lights emitted through the side surfaces of the light-emitting diodes ED may exit between the patterns PT and may be directed toward the structure STR_5. The structure STR_5 includes the upper layer ST2 having a material having a high reflectivity similar to the electrodes RME1 and RME2, and thus incident light can be reflected. Accordingly, in the display device 10_5, the patterns PT may be spaced apart from one another to improve light emission efficiency of the light-emitting diodes ED, and to increase the amount of light directed toward the upper side of the first substrate SUB.

Incidentally, even though the upper layer ST2 may include the same material as the electrodes RME1 and RME2, the upper layer ST2 and the electrodes RME1 and RME2 may be electrically insulated from each other by the first passivation layer PAS1. The first passivation layer PAS1 may be disposed on (e.g., directly on) the upper layer ST2. The electrodes RME1 and RME2 and the upper layer ST2 of the structure STR_5 may not be directly connected with each other.

Figure 19:
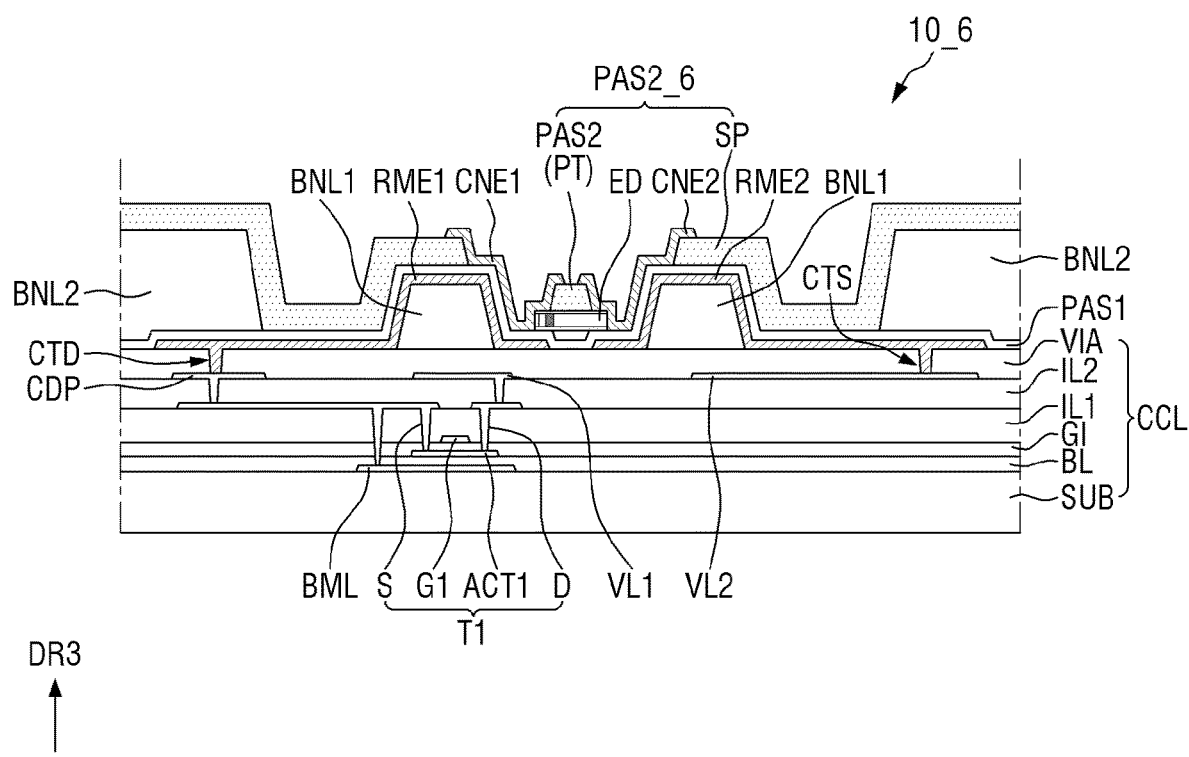
FIG. 19 is a schematic cross-sectional view showing a part of a display device according to another embodiment of the disclosure.

FIG. 19 is a schematic cross-sectional view showing a part of a display device according to another embodiment of the disclosure.

Referring to FIG. 19, in a display device 10_6 according to an embodiment, a second passivation layer PAS2_6 may further include bases SP disposed at other locations than patterns PT. The second passivation layer PAS2_6 may include bases SP spaced apart from the light-emitting diodes ED in the second direction DR2, in addition to the patterns PT that cover and fix the light-emitting diodes ED.

The second passivation layer PAS2_6 may be disposed to partially surround the outer surfaces of the light-emitting diode ED so that the first end and the second end of the light-emitting diode ED may not be covered. The patterns PT of the second passivation layer PAS2_6 may be spaced apart from one another in the first direction DR1 on the first passivation layer PAS1, thereby forming a linear or island-like pattern in each of the sub-pixels PXn.

The bases SP of the second passivation layer PAS2_6 may be spaced apart from the light-emitting diodes ED and disposed on the first passivation layer PAS1. The bases SP may partially overlap the first electrode RME1 and the second electrode RME2 and may also be disposed on the second bank BNL2. Such a shape of the second passivation layer PAS2_6 may be formed by disposing the second passivation layer PAS2_6 entirely on the first passivation layer PAS1 and the second bank BNL2 and performing a pattern process for simultaneously forming the patterns PT and the ends of the light-emitting diodes ED. Since the second passivation layer PAS2_6 can be formed by removing only partially via the patterning process, it may be advantageous in terms of the fabricating process.

Figure 20:
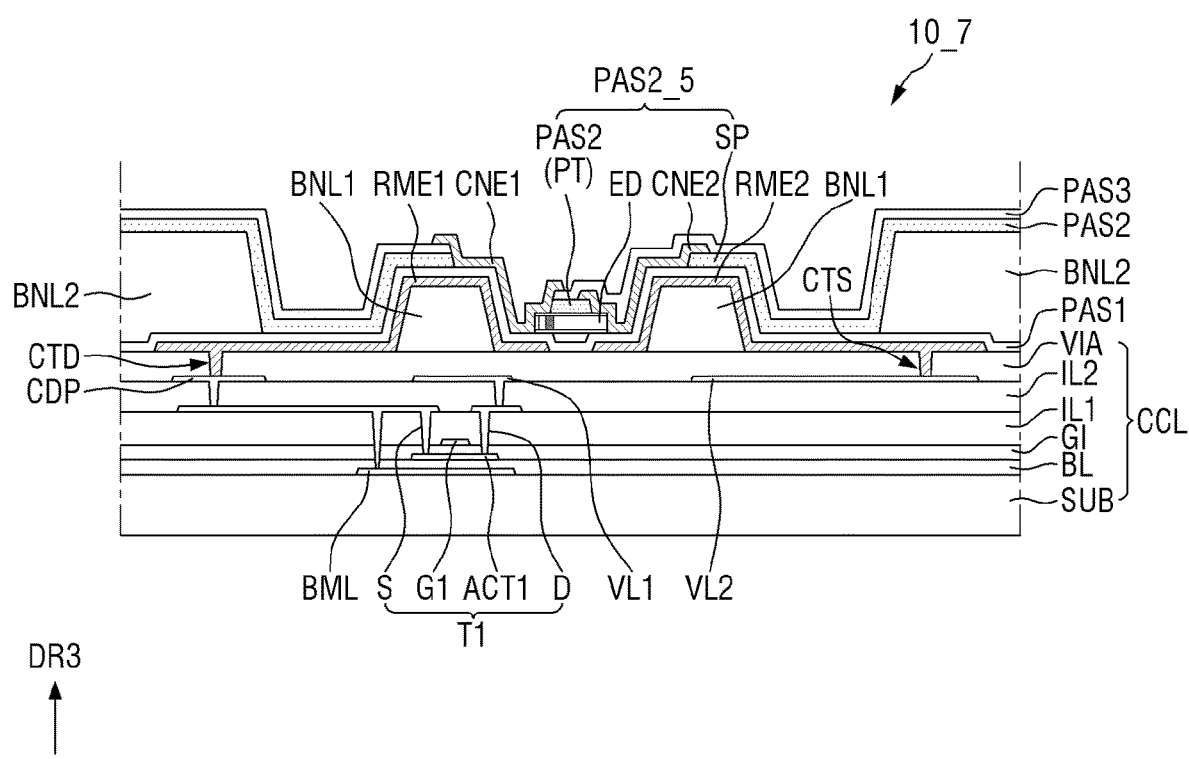
FIG. 20 is a schematic cross-sectional view showing a part of a display device according to another embodiment of the disclosure.
Figure 21:
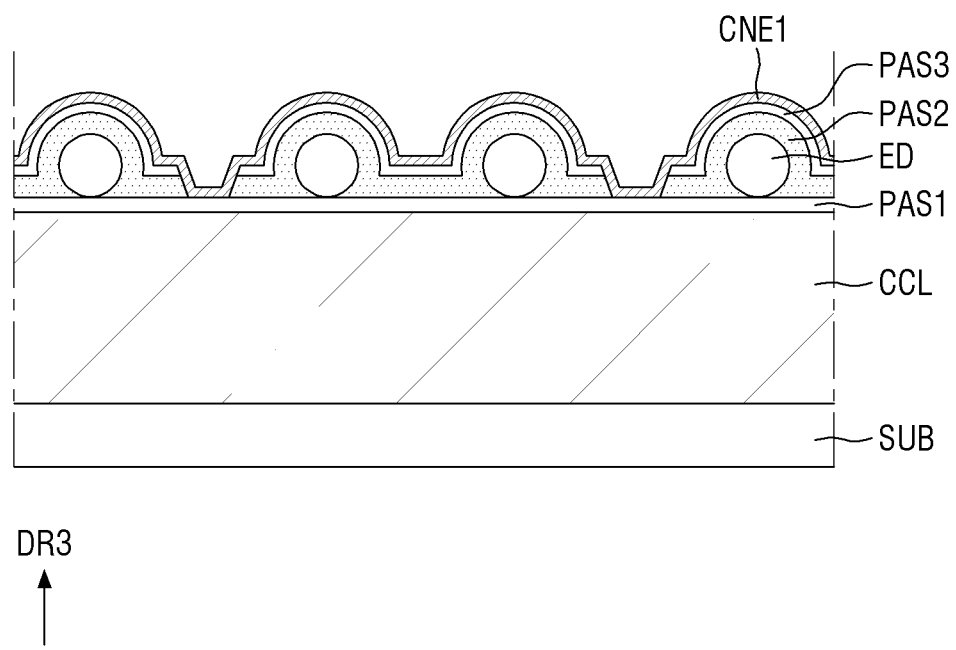
FIG. 21 is a schematic cross-sectional view showing another part of the embodiment of FIG. 20.

FIG. 20 is a schematic cross-sectional view showing a part of a display device according to another embodiment of the disclosure. FIG. 21 is a schematic cross-sectional view showing another part of the embodiment of FIG. 20.

Referring to FIGS. 20 and 21, a display device 10_7 according to an embodiment may further include a third passivation layer PAS3 disposed on the second passivation layer PAS2_5. The contact electrodes CNE1 and CNE2 of the display device 10_7 may be disposed on different layers with the third passivation layer PAS3 therebetween.

The third passivation layer PAS3 may be disposed on the first passivation layer PAS1, the second passivation layer PAS2_5, and the second contact electrode CNE2. The third passivation layer PAS3 may be entirely disposed on the first passivation layer PAS1 and the second passivation layer PAS2_5, with the first ends of the light-emitting diodes ED exposed, at which the first contact electrode CNE1 may be disposed. A part of the first contact electrode CNE1 may be disposed on the third passivation layer PAS3. The first contact electrode CNE1 and the second contact electrode CNE2 may be insulated from each other by the third passivation layer PAS3.

A part of the third passivation layer PAS3 may be separated together during a process of forming the patterns PT of the second passivation layer PAS2. Specifically, the part of the third passivation layer PAS3 disposed on the pattern PT may be spaced apart in the first direction DR1, and the contact electrodes CNE1 and CNE2 disposed between the patterns PT may be disposed on (e.g., directly disposed on) the first passivation layer PAS1.

In the above-described embodiments, the first contact electrode CNE1 and the second contact electrode CNE2 may be formed at the same time and may be spaced apart from each other on the patterns PT. In contrast, in the display device 10_7 according to this embodiment, at least one insulating layer may be disposed between the contact electrodes CNE1 and CNE2, and accordingly the contact electrodes CNE1 and CNE2 may be formed via different processes. In the display device 10_7 according to this embodiment, the contact electrodes CNE1 and CNE2 in contact with the same light-emitting diode ED can be insulated from each other by the third passivation layer PAS3, and thus it may be possible to prevent a short circuit due to the residues of the connection electrode materials during the fabricating process.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a substrate;
   a first electrode on the substrate and extending in a first direction;
   a second electrode on the substrate and extending in the first direction, the second electrode being spaced apart from the first electrode in a second direction;
   a first insulating layer on the first electrode and the second electrode;
   light-emitting elements on the first insulating layer, the light-emitting elements being disposed on the first electrode and the second electrode;

a second insulating layer disposed on the light-emitting elements;

a first contact electrode disposed on the first electrode and electrically contacting the light-emitting elements; and a second contact electrode disposed on the second electrode and electrically contacting the light-emitting elements, wherein the second insulating layer comprises patterns that cover at least part of the light-emitting elements and are spaced apart from one another in the first direction, and a length of each of the patterns measured in the first direction is greater than a distance between the patterns spaced apart from one another in the first direction.

2. The display device of claim 1, wherein a length of each of the patterns measured in the second direction is smaller than a length of the light-emitting elements, the first contact electrode contacts an end of each of the light-emitting elements, the second contact electrode contacts another end of each of the light-emitting elements, the end and the another end of each of the light-emitting elements are exposed from the patterns, and the patterns are not disposed on the end and the another end of each of the light-emitting elements.

3. The display device of claim 1, further comprising:

first banks disposed between the substrate and the first electrode and between the substrate and the second electrode, wherein the patterns of the second insulating layer are between the first banks.

4. The display device of claim 3, wherein a length of each of the patterns measured in the first direction is greater than a distance between a center of the patterns and a center of the first banks.

5. The display device of claim 1, wherein the light-emitting elements are not disposed between the patterns spaced apart in the first direction.

6. The display device of claim 5, wherein the first contact electrode and the second contact electrode are disposed directly on the first insulating layer between the patterns spaced apart from one another in the first direction.

7. The display device of claim 1, wherein the second insulating layer comprises an organic insulating material, and each of the patterns has a flat upper surface.

8. The display device of claim 1, wherein the second insulating layer comprises an organic insulating material, and each of the patterns has a curved upper surface.

9. The display device of claim 1, wherein each of the first contact electrode and the second contact electrode comprises:

first electrode portions partially disposed over the patterns; and second electrode portions disposed between the first electrode portions and located between the patterns spaced apart from one another, and a width of the first electrode portions is greater than a width of the second electrode portions.

10. The display device of claim 9, wherein a length of the first electrode portions measured in the first direction is equal to a length of the pattern parts, and a distance between the first electrode portions in the first direction is equal to a distance between the patterns in the first direction.

11. The display device of claim 1, further comprising:

structures between the patterns which are spaced apart from one another in the first direction, wherein the light-emitting elements are disposed between the structures which are spaced apart from one another in the first direction.

12. The display device of claim 11, wherein a width of the structures measured in the second direction is smaller than a distance between the first electrode and the second electrode.

13. The display device of claim 11, wherein each of the structures comprises:

a bottom layer; and an upper layer disposed to cover the bottom layer, and the upper layer and the first electrode or the upper layer and the first contact electrode comprise a same material.

14. The display device of claim 1, wherein the second insulating layer comprises a base that overlaps the first electrode and the second electrode, and the base is spaced apart from the light-emitting elements in the second direction.

15. The display device of claim 14, further comprising:

a third insulating layer disposed on the second insulating layer, wherein the first contact electrode is disposed on the third insulating layer, and the second contact electrode is disposed between the second insulating layer and the third insulating layer.

* * * * *